(12) United States Patent
Jones

(10) Patent No.: US 11,333,725 B2
(45) Date of Patent: *May 17, 2022

(54) MONONUCLEAR MRI UPGRADE SYSTEM AND METHOD

(71) Applicant: ScanMed, LLC, Omaha, NE (US)

(72) Inventor: Randall W. Jones, Omaha, NE (US)

(73) Assignee: ScanMed, LLC, Omaha, NE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/994,997

(22) Filed: Aug. 17, 2020

(65) Prior Publication Data

US 2021/0003647 A1 Jan. 7, 2021

Related U.S. Application Data

(63) Continuation of application No. 15/909,351, filed on Mar. 1, 2018, now Pat. No. 10,761,159.

(60) Provisional application No. 62/465,441, filed on Mar. 1, 2017.

(51) Int. Cl.
*G01R 33/36* (2006.01)

(52) U.S. Cl.
CPC ..... *G01R 33/3657* (2013.01); *G01R 33/3614* (2013.01); *G01R 33/3635* (2013.01); *G01R 33/3607* (2013.01); *G01R 33/3628* (2013.01); *G01R 33/3664* (2013.01)

(58) Field of Classification Search
CPC ............ G01R 33/3657; G01R 33/3614; G01R 33/3635
See application file for complete search history.

(56) References Cited

U.S. PATENT DOCUMENTS

| | | | | |
|---|---|---|---|---|
| 2007/0013377 A1* | 1/2007 | Wosik | ................ | G01R 33/3415 324/322 |
| 2009/0251145 A1* | 10/2009 | Kaneko | ............ | G01R 33/34076 324/318 |
| 2012/0081115 A1* | 4/2012 | Reykowski | ........ | G01R 33/3657 324/309 |
| 2015/0369886 A1* | 12/2015 | Menon | ................ | G01R 33/365 324/322 |
| 2017/0146622 A1* | 5/2017 | Yang | ................ | G01R 33/3628 |

\* cited by examiner

*Primary Examiner* — Alvaro E Fortich
(74) *Attorney, Agent, or Firm* — Blanchard & Associates

(57) ABSTRACT

A dual frequency coil package system for use in transmitting and receiving at least two frequencies in an MRI system, including a frequency converter coupled to the MRI system to receive a first frequency through the local transmit coil port and convert the first frequency to a second frequency, a second frequency transmit coil to receive the second frequency from the frequency converter and to transmit the second frequency, a dual tuned receiver coil to receive and to output the at least two frequencies, and a switchable receiver to receive the at least two frequencies output from the dual tuned receiver coil and to transmit the first frequency received from the dual tuned receiver coil directly to the MRI system, and to convert the second frequency received from the dual tuned receiver coil to the first frequency before transmission to the MRI system.

13 Claims, 10 Drawing Sheets

MONONUCLEAR MRI UPGRADE SYSTEM AND METHOD

CROSS-REFERENCE TO RELATED APPLICATIONS

This application is a continuation of U.S. patent application Ser. No. 15/909,351, filed on Mar. 1, 2018, which claimed the benefit of U.S. Provisional Patent Application Ser. No. 62/465,441, filed on Mar. 1, 2017, the contents of which are incorporated herein in their entirety by reference.

BACKGROUND

Magnetic resonance imagining (MRI) has become a recognized and very useful tool for the diagnosis of numerous disease processes and pathologies of the human body, relying on the natural abundance of hydrogen in the body and its nature to precis, or spin, about in quasi-alignment with the strong magnetic field of MRI. MRI provides three-dimensional images of internal structures of a patient (e.g., human or animal). The internal structures may be bone structures, soft tissue (tendons, ligaments, and the like), and organs. MRI is a non-invasive diagnostic test that may determine the state of a disease (e.g., chronic obstructive pulmonary disease (COPD), cancer, and the like), or determine an abnormality in an internal structure (tendon rupture, stress bone fractures, and the like) without subjecting a patient to an invasive procedure, such as a needle biopsy or exploratory surgery.

Many conventional MRI systems are configured for transmitting and receiving radio frequency (RF) at a single RF (e.g., mononuclear systems). Such conventional MRI systems typically transmit and receive RF at the frequency of hydrogen, as this is the most common nuclei in a patient to image. However, hydrogen is not the only nuclei which recesses and can give off a signal in an MRI system, and certainly isn't the only nuclei occurring in the human body. Calcium, carbon, and phosphorous are three others occurring in sufficient quantities that have been exploited to generate signals of clinical interest from the body in a process known as MR spectroscopy, and, of late, actual images based upon the amount and bonding of such nuclei in the body.

Each nuclei has its own precessional frequency that is associated with the magnetic field strength of the MRI system according to the formula $\omega = \sigma Bo$, in which $\omega$ is the precessional frequency f times $2\pi$, or the radian frequency, $\sigma$ is the unique gyromagnetic ratio of the element in units Hz/Tesla, and Bo is the strength of the magnetic field in units Tesla. The most commonly installed and operable field strengths are 1.5 Tesla and 3 Tesla systems. While these systems are described in terms of 1.5 or 3 Tesla, their actual magnetic field strength may vary according to different manufacturers. MRI systems typically are designed to provide easy and temporary connection for various MRI antennae designed to improve the signal quality from different human anatomies; hence, they are anatomically specific antennae which the MRI operator places upon these various anatomies and then connects the antennae to the common ports on the MRI system. These antennae now utilize multiple resonators contained within which connect to multiple receiver inputs on the receiver port of the MRI system and, similarly, anatomic specific transmit antennae connect to the transmit output port so as to focus the transmit energy to a smaller local anatomy versus the entire body, which is the purpose of the MRI system's built-in body transmit/receive coil.

There is an increasing need in clinical MRI which relies upon the use of nuclei, other than hydrogen, occurring naturally within the body, or those temporarily injected or inhaled. Only imaging at the single RF of hydrogen does not always provide sufficient imaging of a patient. For example, when imaging a patient's lungs it is at times preferable to have spatial and temporal imaging, which requires imaging nuclei at a first frequency (e.g., hydrogen) and nuclei at a second frequency (a nuclei other than hydrogen, such as fluorine, xenon, and the like). Flourine-19 is an example of such an element that can be inhaled in an inert form, mixed with air, and due to its natural resonance in MRI, can be exploited to generate images of the lungs and associated parenchyma. However, a mononuclear MRI system is not capable of transmitting and receiving at the second frequency.

A major hurdle preventing more common use of other nuclei is the significant expense associated with making MRI systems able to operate at dual or multiple frequencies associated with different nuclei. This expense is largely due to the significant additional hardware and firmware associated with duplicating the radio frequency (RF) transmit and receiver chains for each additional frequency, or providing more expensive broad-band chains that can operate at substantially different frequencies. Primarily for this reason, most MRI systems are manufactured and installed which operate on a singular frequency—the precessional frequency of hydrogen.

Additionally, conventional MRI systems that have the ability to generate an MRI excitation signal and receive from at least two nuclei frequencies (e.g., a multinuclear capable system) do not always have the ability to switch the frequency for receiving and transmitting contemporaneously when the patient is undergoing an MRI scan. This contemporaneous switching is typically limited by the receiving and transmitting coils of the MRI system. Therefore, in order to upgrade a multinuclear capable system, a transmission coil and receiving coil must be configured to allow the MRI system to transmit and receive at at least two nuclei frequencies.

Some conventional multinuclear capable MRI systems further include a multinuclear transmit body coil. However, these multinuclear capable MRI systems with a multinuclear transmit body coil, typically include multi-channel receiver coils. The multi-channel receiver coils include multiple resonators that typically only have the ability to receive at a frequency for a single nucleus. To configure a multinuclear capable MRI system to receive and transmit at a second frequency, the patient must be removed and a separate, distinct receiver coil having resonators that receive RF from a second, distinct nucleus must be placed on the patient. This causes positioning changes and the ability to spatially compare the images of the first nucleus frequency and the second nucleus frequency may be lost.

Finally, the minority of conventional multinuclear MRI systems that have the ability to contemporaneously switch frequencies that are transmitted and received utilize an intermediate frequency in the receiving coil. Such multinuclear MRI systems utilize a resonator in a receiver coil that does not include a tuned preamplifier, such that the signal received by the resonator is converted to an intermediate frequency prior to amplification. In such a multinuclear MRI system, the intermediate frequency must be converted to MRI system receiver frequency. This two-step frequency conversion, from the frequency of a nucleus to an intermediate frequency, and from the intermediate frequency to the MRI system receiver frequency requires a specialized receiver for the two-step conversion, or alternatively the MRI system receiver, itself, must be modified to accept and process the intermediate frequency generated by the first step of the conversion. This means that either the multinuclear MRI system must come with such a specialized receiver, or that the multinuclear system must further be retrofitted for a receiver with the two-step conversion, or, alternatively, the modification of the existing MRI system receiver increases the complexity of the MRI system, increases the complexity of converting a mononuclear system, and increases the cost associated with each.

Therefore, it would be desirable to have an MRI coil package that may be used to alter a mononuclear MRI system to a multinuclear MRI system that may contemporaneously switch between transmitting and receiving RF at a first nuclei and a second nuclei frequency, in which the receiver coil of the MRI coil package has one or more resonators that receive at at least two frequencies from a first nuclei and a second nuclei. It would be further desirable to have an MRI coil package that may alter a multinuclear capable MRI system to a multinuclear functional MRI system, which may contemporaneously switch between transmitting and receiving RF at a first nuclei and a second nuclei frequency, in which the receiver coil of the MRI coil package has one or more resonators that receive at at least two frequencies from a first nuclei and a second nuclei. Further, it would be desirable that the MRI coil package alter the mononuclear MRI system and the multinuclear capable MRI system to a multinuclear system without the use of an intermediate frequency. Finally, it would be desirable that the MRI coil package provide spatial and temporal imaging of a patient from at least two RF.

BRIEF SUMMARY

According to various example embodiments of the present general inventive concept, a dual frequency coil package system may be provided for use in transmitting and receiving at least two frequencies in an MRI system, including a frequency converter coupled to the MRI system to receive a first frequency through the local transmit coil port and convert the first frequency to a second frequency, a second frequency transmit coil to receive the second frequency from the frequency converter and to transmit the second frequency, a dual tuned receiver coil to receive and to output the at least two frequencies, and a switchable receiver to receive the at least two frequencies output from the dual tuned receiver coil and to transmit the first frequency received from the dual tuned receiver coil directly to the MRI system, and to convert the second frequency received from the dual tuned receiver coil to the first frequency before transmission to the MRI system.

The foregoing and/or other aspects and advantages of the present general inventive concept may be achieved by a dual frequency coil package used in transmitting and receiving at least two frequencies in an MRI system, the dual frequency coil package including a dual tuned receiver coil configured to receive at least two frequencies, including at least a first frequency and a second frequency, in operative communication with the MRI system through a first local port of the MRI system, and a second frequency transmit coil configured to transmit the second frequency in operative communication with the MRI system through a second local port of the MRI system.

The foregoing and/or other aspects and advantages of the present general inventive concept may also be achieved by a frequency converter and receiver system for use with a dual frequency coil package used in an MRI system, the frequency converter and receiver system including, a switchable receiver configured with one or more channels each configured to receive at least two frequencies, including at least a first frequency and a second frequency, each of the one or more channels including, an input configured to receive the at least two frequencies, an output configured output the second frequency, a first frequency path configured to pass the first frequency between the input and the output, a second frequency path configured to convert the second frequency to the first frequency between the input and the output, a first switch configured to switch electrical communication from the input between the first and second frequency paths, and a second switch configured to switch electrical communication to the output between the first and second frequency paths, and a frequency converter configured to receive the first frequency, convert the first frequency to the second frequency, and output the second frequency, wherein the switchable receiver and the frequency converter are configured to be in electrical communication such that the first and second frequencies are in phase after frequency conversions.

The foregoing and/or other aspects and advantages of the present general inventive concept may also be achieved by a dual frequency coil package system for use in transmitting and receiving at least two frequencies in an MRI system, the dual frequency coil package system including a frequency converter selectively coupled to a local transmit coil port of the MRI system, to receive a first frequency through the local transmit coil port, to convert the first frequency to the second frequency, and to output the second frequency, a second frequency transmit coil in electrical communication with the frequency converter so as to receive the second frequency from the frequency converter and to transmit the second frequency in operative communication with the MRI system, a dual tuned receiver coil configured to receive at least two frequencies, including at least the first frequency and the second frequency, and to output the at least two frequencies, and a switchable receiver configured to receive the at least two frequencies output from the dual tuned receiver coil, including at least the first frequency and the second frequency, and in electrical communication with the dual tuned receiver coil and selectively coupled to a local receiver coil port of the MRI system such that the switchable receiver and dual tuned receiver coil are in operative communication with the MRI system, wherein the switchable receiver transmits the first frequency received from the dual tuned receiver coil directly to the MRI system and converts the second frequency received from the dual tuned receiver coil to the first frequency before transmission to the MRI system.

The foregoing and/or other aspects and advantages of the present general inventive concept may also be achieved by a method of using a dual frequency coil package in an MRI system, the method including connecting a dual tuned coil package to local transmit and receive ports of the MRI system, converting a first frequency transmit power signal transmitted from the MRI system through the local transmit port to a second frequency transmit power signal, switching dual tuned resonators to a second frequency signal operating mode, converting second frequency signals received from resonators during a transmit pulse to the first frequency, and transmitting received first and converted first frequency signals to the local receive port of the MRI system for image processing.

Other features and aspects may be apparent from the following detailed description, the drawings, and the claims.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Figure 1:
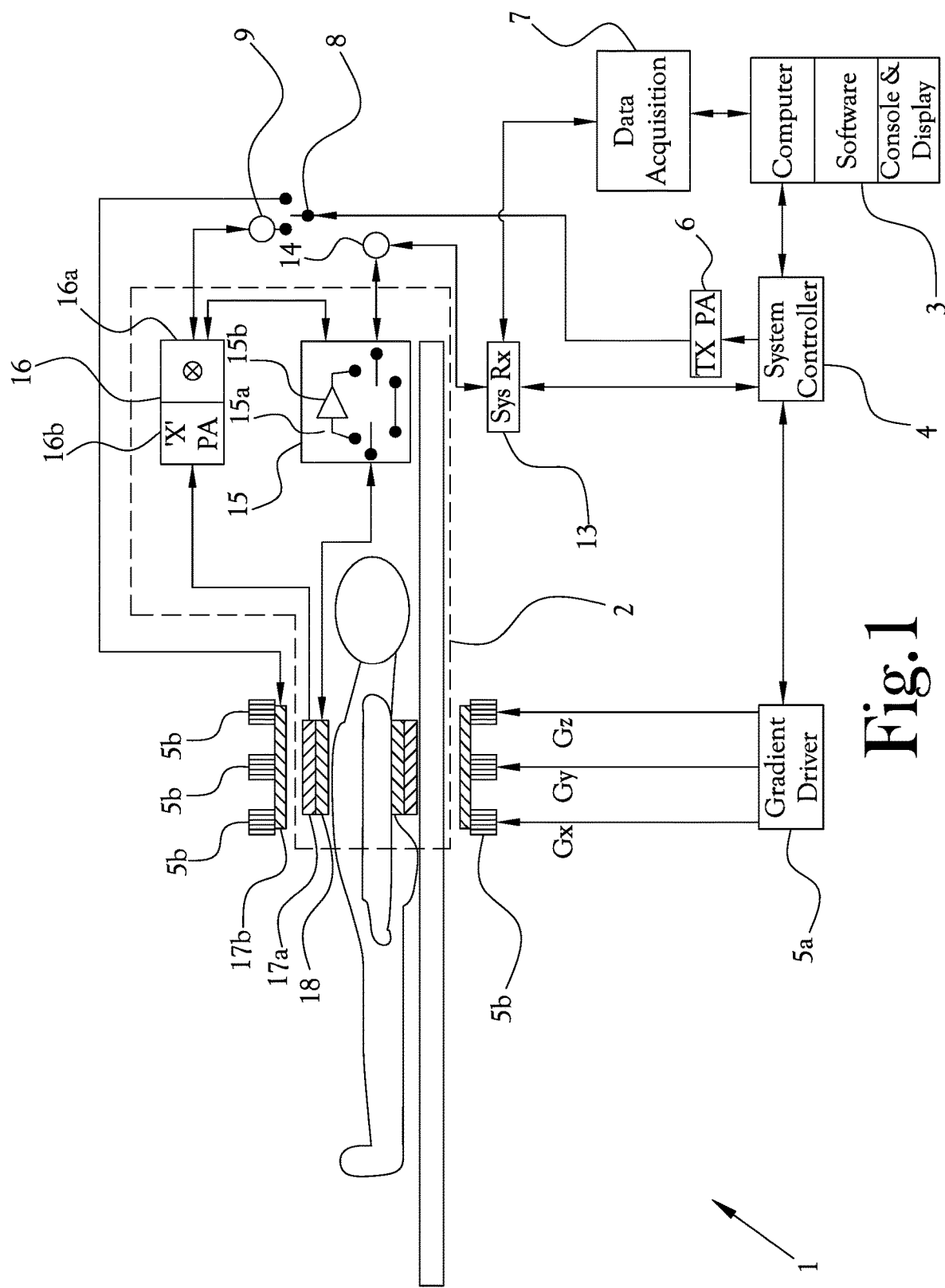
FIG. 1 illustrates an MRI system having a dual tuned coil package.

The described systems may provide a dual frequency coil package system for use in transmitting and receiving at least two frequencies in an MRI system, the dual frequency coil package system including a frequency converter coupled to the MRI system to receive a first frequency through the local transmit coil port and convert the first frequency to a second frequency, a second frequency transmit coil to receive the second frequency from the frequency converter and to transmit the second frequency, a dual tuned receiver coil to receive and to output the at least two frequencies, and a switchable receiver to receive the at least two frequencies output from the dual tuned receiver coil and to transmit the first frequency received from the dual tuned receiver coil directly to the MRI system, and to convert the second frequency received from the dual tuned receiver coil to the first frequency before transmission to the MRI system.

The described systems may provide a dual tuned coil package, and a method of using the dual tuned coil package, to allow existing MRI systems to perform magnetic resonance imaging using nuclei of a plurality of different types of atoms. Various example embodiments of the present general inventive concept may be retrofitted to existing MRI systems by simply plugging into existing ports and allowing the existing MRI system to operate using the same processes otherwise used in detecting, for example, hydrogen nuclei, to detect other nuclei. To achieve these and other aspects of the present general inventive concept, various example embodiments may provide a dual tuned coil package having a dual tuned receiver coil. The dual tuned coil package and dual tuned receiver may transmit and receive two or more nuclei frequencies. Throughout these descriptions, signals having certain frequencies may be referred to simply as frequencies, e.g., a signal having a first frequency may be referred to simply as a first frequency, for a first frequency signal, and so on. The dual tuned coil package may include a dual tuned receiver coil and a second frequency transmit coil. The dual tuned coil package may include a frequency converter, and a switchable receiver. The dual tuned receiver coil may have one or more dual tuned resonators configured to receive at least two radio frequencies (RF) associated with two or more MRI nuclei. The one or more dual tuned resonators may operate at RF that are close in value (e.g., within approximately 7%, or approximately 15%, of one another in regard to the hydrogen Larmor frequency). The one or more dual tuned resonators may operate at RF that are far (e.g., more than approximately 7%, or more than approximately 15%) apart. The one or more dual tuned resonators may be configured to receive and transmit at the at least two RF to provide spatial and temporal imaging of a patient using an MRI system. The dual tuned resonators may include switching additional parallel capacitances across existing resonant capacitors, shorting out series capacitors to increase the total capacitance, driving varactors in parallel with tuning capacitors with precision voltages to tune to various frequencies, and combinations thereof to tune the dual tuned resonators to two or more frequencies. The dual tuned resonators may include switches, such as solid state single pole, single throw (SPST) switches, single pole double throw (SPDT), single pole triple throw (SPTT) switches, diode combinations, and combinations thereof to switch resonance of the dual tuned resonator to two or more frequencies.

FIG. 1 illustrates an MRI system having a dual tuned coil package. As illustrated in FIG. 1, an MRI system 1 is provided with a dual tuned coil package 2 that may include various componentry described herein. The dual tuned coil package 2 may be configured to convert a mononuclear MRI system to a system that may transmit and receive at at least two nuclei frequencies (multinuclear ready system). The dual tuned coil package 2 may be configured to convert a multinuclear capable system to a multinuclear ready system. In the example embodiment illustrated in FIG. 1, the MRI system 1 includes an operator console 3, a system controller 4, a gradient driver 5a, gradient axes 5b, a transmit power amplifier 6, a data acquisition component 7, a frequency switch assembly 8, a local transmit coil port 9, an analog converter receiver 13, a scanner receiver coil port 14, a system body coil 17b, and the dual tuned coil package 2. The system body coil 17b may be interchangeable referred to throughout these descriptions as the first frequency transmit coil 17b, as the frequency conventionally transmitted from the transmit power amplifier 6 to the system body coil 17b or local transmit coil port 9 is described as the first frequency in relation to the second frequency which may be applied to the transmit coil of the dual tuned coil package 2 as described herein.

The operator console 3 includes a computer and programmable configuration software, and is configured to display images. For example, the MRI system 1 may be programmed to image a patient via an input received at the operator console 3. As used herein the computer may refer to a general-purpose device that can be programmed to carry out various sets of arithmetic or logical operations. Further, the computer may include one or more processing elements (e.g., processors, central processing unit (CPU)) and some form of memory (e.g., data storage device, database), the memory being connected to (e.g., communicatively coupled with) the processing element(s). The computing device may further include one or more user interface devices (e.g., user input devices), such as a keyboard, mouse, display, and/or the like, which are connected to (e.g., communicatively coupled with) the processing element(s).

The system controller 4 is configured to activate and deactivate the gradient driver 5a, the data acquisition component 7, and the transmit power amplifier 6. The system controller 4 is in operative communication with the operator console 3.

The data acquisition component 7 is configured to process RF received from the dual tuned coil package 2. The data acquisition component 7 is configured to be in operative communication with the operator console 3 and the analog converter receiver 13. The gradient driver 5a is configured to drive current and voltages of the gradient axes 5b. The gradient driver 5a is configured to be in operative communication with the system controller 4 and the gradient axes 5b. The gradient axes 5b are configured to modulate the static magnetic field to produce three dimensional (3D) spatial encoding. The gradient axes 5b are in operative communication with the gradient driver 5a.

The transmit power amplifier 6 may amplify a first frequency to transmit to the frequency switch assembly 8 to be routed to the system body coil 17b or through the local transmit coil port 9. The transmit power amplifier 6 is in operative communication with the system controller 4 and the frequency switch assembly 8. The analog converter receiver 13 converts the analog RF signal from the scanner receiver coil port 14, which is in communication with the dual tuned coil package 2, to a digital signal. The analog converter receiver 13 is in operative communication with the MRI scanner receiver coil port 14, and the system controller 4. The receiver coil port 14 includes a plurality of channels to respectively receive signals from, and to control, multiple resonance elements in a receiver coil, and the analog converter receiver 13 includes respective amplifiers and analog to digital converters for each channel of the receiver coil port 14, based on the MRI system channel count. The first frequency transmit coil 17b is configured to transmit a first frequency into the patient to excite nuclei of a first frequency. The first frequency transmit coil 17b may transmit at the frequency of hydrogen nuclei, which is approximately 123.2 megahertz (MHz) for a 3 Tesla MRI system, and which may be referred to herein as the hydrogen frequency.

The dual tuned coil package 2 includes a second frequency transmit coil 17a, and a dual tuned receiver coil 18. The dual tuned coil package 2 may further include a frequency converter 16, which may be referred to herein as a switchable power amplifier, having frequency conversion logic 16a and a second frequency power amplifier 16b, and a switchable receiver 15 having a switch 15a and a frequency converter and amplifier 15b.

Figure 6:
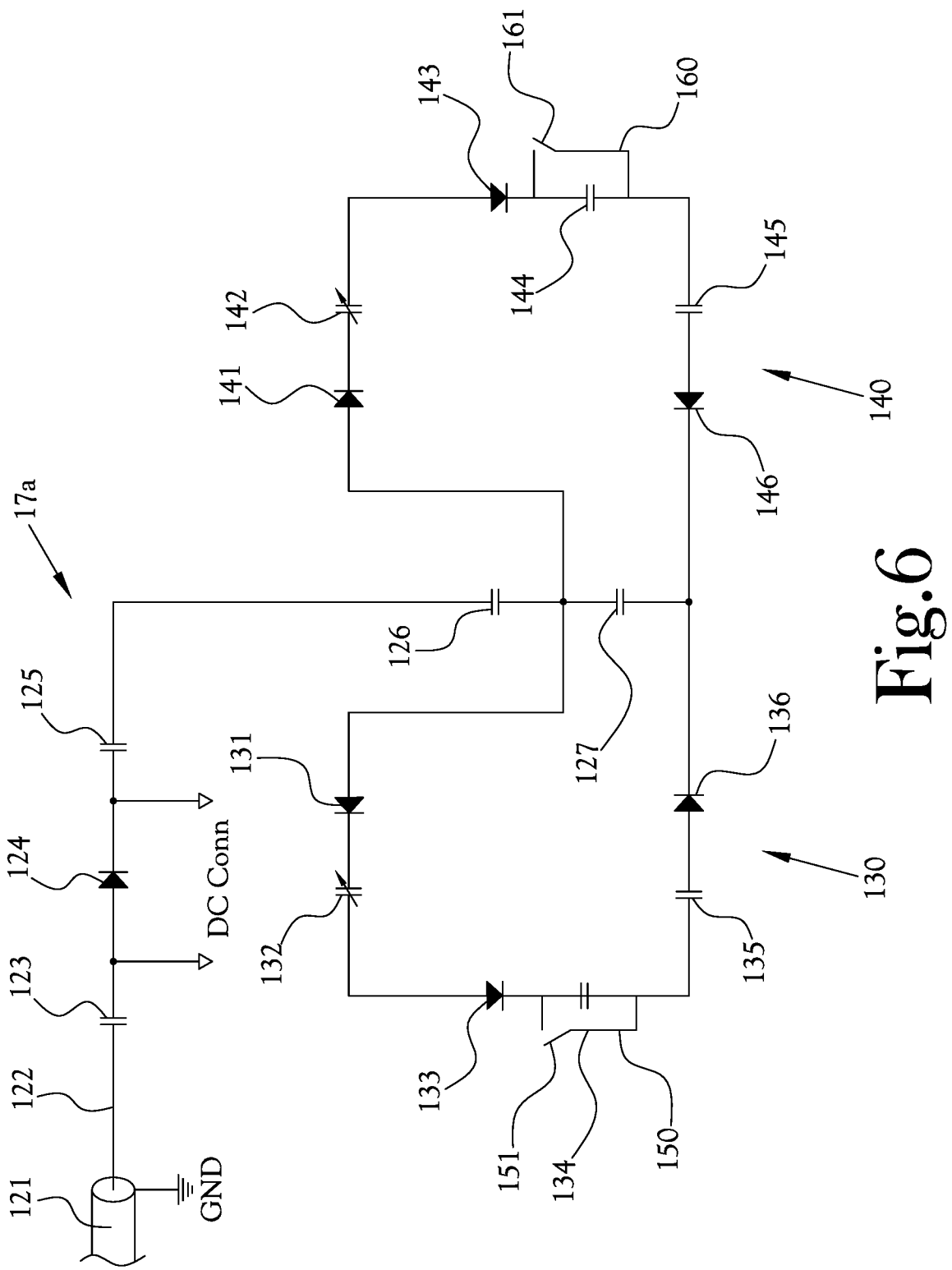
FIG. 6 illustrates a second frequency transmit coil of a dual tuned coil package.

The second frequency transmit coil 17a transmits a second frequency relative to the first frequency transmitted by the system body coil, or first frequency transmit coil, 17b. The second frequency transmit coil 17a may further transmit two or more frequencies. The second frequency may be close (within, for example, 7%, or 15%) to the first frequency, such as approximately 115.9 MHz, which is the frequency of fluorine nuclei for a 3 Tesla MRI system. The second frequency may be far apart (e.g., more than 7%, or 15%) from the first frequency, such as approximately 15 MHz, which is the frequency of xenon nuclei for a 3 Tesla MRI system. The second frequency transmit coil 17b may be in operative communication with the second frequency power amplifier 16b. An example embodiment of the second frequency transmit coil 17b is illustrated in FIG. 6, and is described herein.

The dual tuned receiver coil 18 may receive at least two different RF from excited nuclei of the patient. The dual tuned receiver coil 18 may receive at least two RF from nuclei that are close together. The dual tuned receiving coil 18 may receive at least two RF that are far apart. The dual tuned receiving coil 18 may be in operative communication with the switchable receiver 15. The dual tuned receiving coil 18 may have one or more dual tuned resonators 10, example embodiments of which are illustrated in FIGS. 2-5, and are described herein.

The frequency conversion logic 16a, which may be referred to at times simply as the frequency converter, may convert the first frequency pulses from the transmit power amplifier 6 to pulses of the second frequency. The frequency conversion logic 16a may further deliver synchronization signals to the switchable receiver 15 to maintain a proper phase relationship (e.g., phase locking between the transmit and receive signals) between the transmission and receipt of the second frequency, such as via a direct, operative connection. The frequency conversion logic 16a may be in operative communication with the system controller 4 and the second frequency power amplifier 16b, and may be in operative communication with the switchable receiver 15.

The second frequency power amplifier 16b amplifies the transmission of the second frequency to the second frequency transmit coil 17a. The second frequency power amplifier 16b may amplify the transmission of one or more frequencies. The second frequency power amplifier 16b is in operative communication with the frequency conversion logic 16a and the second frequency transmit coil 17a, and the second frequency power amplifier 16b may be in operative communication with the frequency conversion logic 16a and the second frequency transmit coil 17a via the local transmit coil port 9, sometimes referred to as an MRI system port, that is in electrical communication with the frequency switch assembly 8, which may be used to switch transmit modes in the MRI system.

The switchable receiver 15 may include multiple channels to respectively receive signals from receiver coil resonators and communicate with the channels of the receiver coil port 14, and each channel may include a switchable receiver switch 15a and a second frequency converter and amplifier 15b. In the descriptions herein, the signal development in only one of the channels is typically described for the sake of clarity. The switchable receiver 15 may transmit the first frequency to the analog converter receiver 13 without amplification or conversion. The switchable receiver switch 15a engages or bypasses the second frequency converter and amplifier 15b. When the dual tuned receiver coil 18 receives at the first frequency the switchable receiver switch 15a bypasses the second frequency converter and amplifier 15b. When the dual tuned receiver coil 18 receives at the second frequency, the switchable receiver switch 15a engages the second frequency converter and amplifier 15b. The switchable receiver switch 15a may be a bipolar logic switch in operative communication with the system controller 4.

The second frequency converter and amplifier 15b may amplify the second frequency and convert the second frequency to the first frequency when the dual tuned receiver coil 18 receives at the second frequency. The second frequency converter and amplifier 15b may be in operative communication with the dual tuned receiver coil 18 and the analog converter receiver 13. The switchable receiver 15 may be in operative communication with the dual tuned receiver coil 18 via the scanner receiver coil port 14.

The frequency switch assembly 8 routes the first frequency transmit pulse from the power amplifier 6 to either the first frequency transmit coil, or system body coil, 17b or to the local transmit coil port 9. The frequency switch assembly 8 may be a bipolar logic switch in operative communication with the system controller 4. When the frequency switch assembly 8 is in a first position it routes the first frequency transmit pulse to the first frequency transmit coil 17b coil. When the frequency switch assembly 8 is in a second position it routes the first frequency transmit pulse to the local transmit coil port 9, to be received by the second frequency conversion logic 16a.

Figure 2:
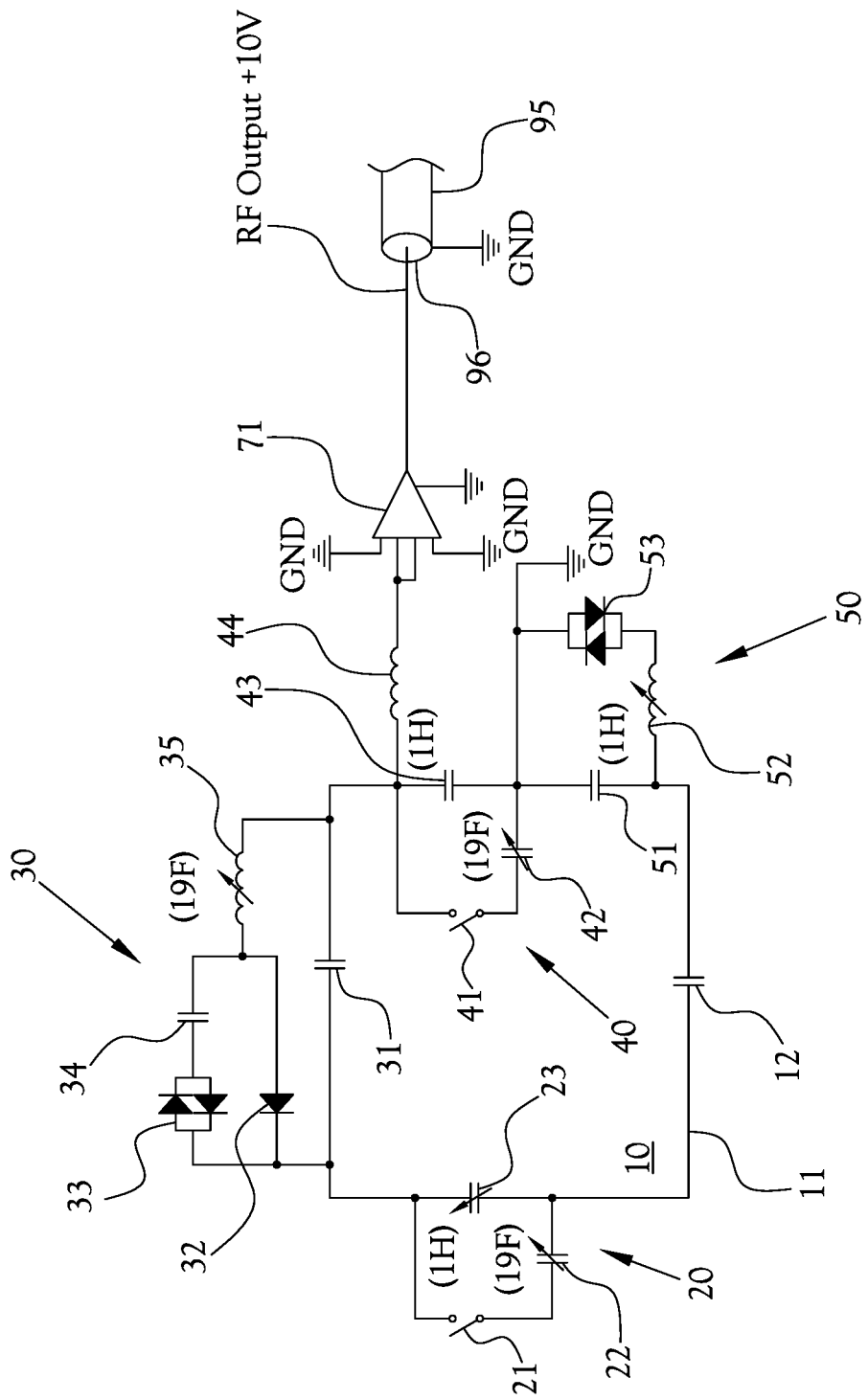
FIG. 2 illustrates a dual tuned resonator of a dual tuned receiver coil.

FIG. 2 illustrates a dual tuned resonator of a dual tuned receiver coil. In the example embodiment of FIG. 2, the dual tuned resonator 10 configured to be provided to the dual tuned receiver coil 18 receives at least two RF that are substantially close together, e.g., within approximately 7%, or within approximately 15%, of one another in regard to the hydrogen Larmor frequency. While it is to be understood that the dual tuned receiver coil 18 may include one or more dual tuned resonators 10, for illustration purposes a single dual tuned resonator is described and illustrated in FIG. 2. The dual tuned resonator 10, which may be formed with an inductive wire 11, includes one or more constant capacitors 12, 31, 43 and 51, at least one variable frequency circuit 20, a first frequency decoupler 50, and a second frequency decoupler 30. The dual tuned resonator 10 further includes a preamplifier circuit 40. The dual tuned resonator 10 may be made of a material with high conductivity properties, such as copper tape, copper strip etched on rigid substrate, copper strips etched on flexible substrate, and so on.

In this embodiment, the one or more constant capacitors 12, 31, 43, and 51 generate resonant frequency of the dual tuned resonator 10 at a first RF, such as approximately 123.2 MHz, which is the RF of hydrogen on conventional 3 Tesla MRI systems. At least one of the constant capacitors 12, 31, 43 and 51 may be of any capacitance to generate resonant frequency of the first RF for the dual tuned resonator 10. In various example embodiments of the present general inventive concept, it may be beneficial to configure the dual tuned resonator 10 such that the one or more capacitors 12, 23, 31, 43, and 51 are of substantially the same capacitance.

The at least one variable frequency circuit 20 shifts the resonant frequency of the dual tuned resonator 10 to a second RF, such as approximately 115.9 MHz, which is the RF resonance frequency of fluorine on conventional 3 Tesla MRI systems. The variable frequency circuit 20 may include a variable capacitor 22 arranged to be in parallel with a variable capacitor 23, and a switch 21. The variable capacitor 22 may be of any capacitance to generate a resonant frequency of the second RF for the dual tuned resonator 10 when it is activated. The variable frequency circuit 20 may also be a voltage-controlled varactor (not pictured) which is activated at both the first and the second frequency. The varactor is controlled by application of a tuning voltage, where a voltage is applied to the varactor in parallel with the variable capacitor 22 to provide resonance at the second frequency.

The switch 21 of the variable frequency circuit 20 activates and deactivates the variable frequency circuit 20. The switch 21 may be any mechanism for activating and deactivating the variable frequency circuit 20, such as a single pole single throw switch (SPST), microelectromechanical system (MEMS) switch, or a PIN diode. When the switch 21 is in an open position the additional capacitance 22 is deactivated, and the dual tuned resonator 10 has a resonant frequency at the first frequency. When the switch 21 is in a closed position the additional capacitance of variable capacitor 22 is activated, and the dual tuned resonator 10 has a resonant frequency at the second frequency. The switch 21 may be engaged by DC control from the MRI system 1 via common DC control signals provided at the MRI system receiver coil port 14.

The first frequency decoupler 50 performs passive decoupling of the dual tuned resonator 10 during the transmit cycle of the first frequency. The first frequency decoupler 50 generates a high impedance resonance circuit for the first frequency during the transmit cycle of the first frequency. The first frequency decoupler 50 includes a first frequency variable inductor 52, crossed PIN diodes 53, and at least one constant capacitor, such as constant capacitor 51. To passively decouple, a capacitive reactance of constant capacitor 51 is selected to equal the inductive reactance of inductor 52 to create a resonant circuit when connected in parallel. The constant capacitor 51 and the first frequency variable inductor 52 are connected in parallel when the crossed PIN diodes 53 are activated at the onset of the transmit pulse from the MR system 1 (not pictured) which develops voltage across the constant capacitor 51, which biases the crossed PIN diodes 53 and creates a parallel resonant tank circuit in the first frequency decoupler 50.

The second frequency decoupler 30 performs active decoupling of dual tuned resonator 10 during transmission of the second frequency. The second frequency decoupler 30 may further perform passive decoupling of the dual tuned resonator 10 during transmission of the second frequency. The second frequency decoupler 30 includes a second frequency variable inductor 35, at least one constant capacitor, such as constant capacitor 31, a crossed PIN diode 33 to perform passive decoupling, an actively biased diode 32, and a direct current (DC) blocking capacitor 34.

This second frequency decoupler 30 operates substantially similar to the first frequency decoupler 50 when passively decoupling at the second frequency via the cross-PIN diode 33 and DC blocking capacitor 34. The second frequency decoupler 30 may further actively decouple, wherein a direct current (DC) control voltage generated by the MRI system 1, and synchronized with the transmit pulse timing, is connected across active diode 32 via separate control lines (not pictured). Therefore, the second frequency variable inductor 35 is configured to generate a high impedance resonance circuit with the constant capacitor 31 during transmission of the second frequency. The second frequency variable inductor 35 may be any inductance to generate the high impedance resonance circuit with capacitance of constant capacitor 31 when in parallel. Further, the second frequency variable inductor 35 may be actively switched into parallel circuit with the synchronization of the DC control voltage across the PIN diode 32.

The second frequency decoupler 30 includes the active and passive decoupling for safety. The active and passive decoupling is redundant. Specifically, the second frequency decoupler 30 will still operate and decouple without the DC control voltage from the MRI system, for active decoupling, via passive decoupling using the crossed PIN diodes 33. This improves the safety of the dual tuned resonator 10 and the dual tuned receiver coil 18 in the event of a faulty DC control voltage or broken DC pathway. The active and passive decoupling of the second frequency decoupler 30 may be employed on each dual tuned resonator 10, where such a decoupler may be tuned to the first and the second frequencies. Likewise, the first frequency decoupler 50 may be configured to actively and passively decouple similar to the second frequency decoupler 30.

The preamplifier circuit 40 is configured to develop the MRI signal of the dual tuned resonator 10 for a preamplifier 71. The MRI signal may be amplified from 20 to 30 decibels (dB) as determined by the MRI system receiver requirements, and to match output impedance from the preamplifier 71 of the dual tuned resonator 10 to the MR system analog converter receiver 13 of MRI system 1. The preamplifier circuit 40 includes a preamplifier circuit inductor 44, and the preamplifier 71. The preamplifier circuit 71 further includes at least one constant capacitor, such as constant capacitor 43.

The preamplifier input circuit 40 may develop the MRI signal across constant capacitor 43 and deliver it through isolation inductor 44 to the preamplifier 71. Constant capacitor 43 is selected by its relative real component of resonance impedance of the first and second frequencies. This value may be from 50 to 200 ohms during resonance. The isolation inductor 44 is configured to match the resonance of constant capacitor 43. The isolation inductor 44 is a low Q or broadband inductor selected to equal the average reactance of the capacitor 43, where the average is the average of the reactance at the first frequency and the second frequency. Matching reactances of constant capacitor 43 and isolation inductor 44 at the average resonant frequencies of the first and second frequencies creates a high impedance condition in the preamplifier input circuit 40 due to the connection of the preamplifier 71. This effectively places constant capacitor 43 in parallel with inductor 44 creating a high impedance tank circuit of the preamplifier circuit 40. The high impedance tank circuit of the preamplifier circuit 40 then develops the RF signals received by the dual tuned resonator 10, while impeding any undesirable currents induced in other nearby dual tuned resonators, substantially similar to dual tuned resonator 10. This prevents undesired mutual coupling between dual tuned resonators.

The preamplifier 71 amplifies both the first and second frequencies as well as match the output impedance of the dual tuned resonator 10 to the MR system receiver 13 of MR system 1 to within 5 ohms, where the MR system receiver 13 is approximately 50 ohms. The preamplifier 71 may be either a narrowband or broadband preamplifier. In this FIG. 2, the preamplifier 71 is a low-input impedance broadband preamplifier, which has a resistance of less than 10 ohms from its input to ground. In various example embodiments it may be beneficial to configure the preamplifier 71 to have a resistance of less than 1 ohm from its input to ground. The preamplifier 71 may operate using the DC voltage provided by the MR system 1 on a connecting cable center pin (not pictured).

Figure 3:
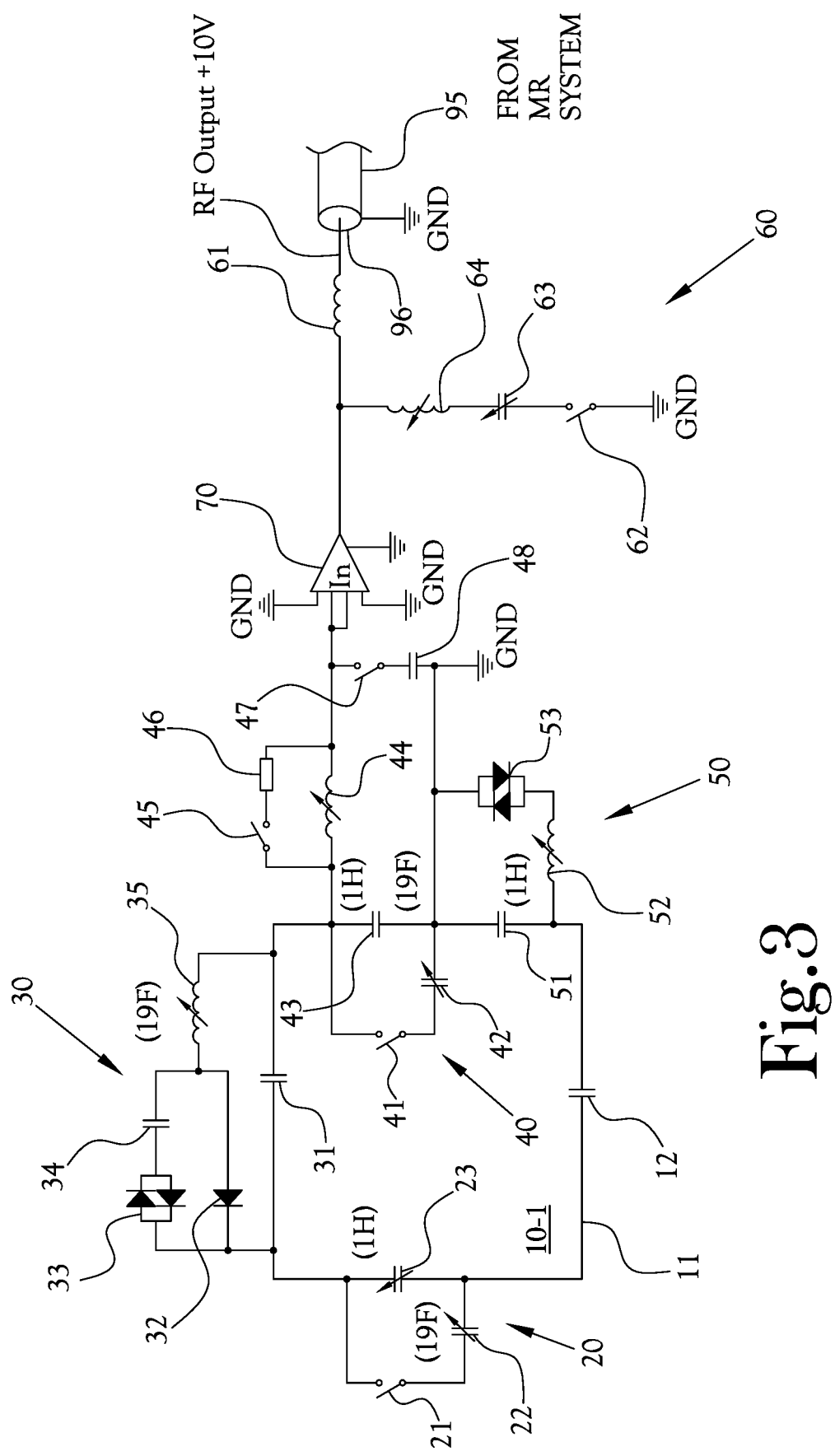
FIG. 3 illustrates a dual tuned resonator of a dual tuned receiver coil.

FIG. 3 illustrates a dual tuned resonator of a dual tuned receiver coil. Similar to the example embodiment illustrated in FIG. 2, the example embodiment illustrated in FIG. 3 shows a dual tuned resonator 10-1 that is configured to receive at least two RF that are close together, such as, for example, within 7%, or within 15%, of the hydrogen frequency. This may account for output impedance changes due to frequency bandwidth shift in narrow band amplifiers, wherein the larger the shift, the greater the output impedance shift. While a dual tuned receiver coil 18 may include one or more dual tuned resonators, for illustration purposes a single dual tuned resonator 10-1 is described in this FIG. 3. Like the dual-tuned resonator 10 illustrated in FIG. 2, the dual tuned resonator 10-1 includes one or more constant capacitors 12, 31, 43 and 51, at least one variable frequency circuit 20, first frequency decoupler 50, second frequency decoupler 30, and preamplifier circuit 40. The dual tuned resonator 10-1 may be made of a material with high conductivity properties, such as copper tape, copper strip etched on rigid substrate, copper strips etched on flexible substrate, and so on. The at least one constant capacitor 12, 31, 43, and 51, the at least one variable frequency circuit 20, the first frequency doupler 50, and the second frequency decoupler 30 are substantially the same as their corresponding elements in FIG. 2.

The preamplifier circuit 40 of the dual tuned resonator 10-1 includes at least one constant capacitor, such as constant capacitor 43, and the preamplifier circuit inductor 44, which are substantially the same as their corresponding elements in FIG. 2. The preamplifier circuit 40 further includes a variable preamplifier capacitor 42, a preamplifier circuit inductor 44, a reactance 46, input capacitor 48, one or more preamplifier switches 41, 45, and 47, the preamplifier 70, and a MR inductor 61.

The preamplifier capacitor 42 is configured to assist in shifting the resonant frequency of the dual tuned resonator 10-1 to the second frequency. Further, preamplifier capacitor 42 also alters the input impedance of resonator 10-1 to the preamplifier 70 to match the second frequency when the dual tuned resonator 10-1 has resonant frequency at the second frequency. The capacitor 42 may be of any capacitance to shift the resonant frequency of the dual tuned resonator 10-1 and shift the input impedance of the dual tuned resonator 10-1 to the preamplifier 70.

The preamplifier capacitor 48 shifts the center of the preamplifier 70 operating bandwidth to the second frequency of the dual tuned resonator 10-1, such as approximately 115.9 MHz, which is the RF of fluorine on conventional 3 Tesla MRI systems. The preamplifier capacitor 48 is switched into the preamplifier 70 input when switch 47 is closed. This switch closes simultaneously or nearly simultaneously with the switches 21, 41, 45, and 62 to create a second operating mode for the preamplifier 70 at the second frequency. The switch 47 may be engaged by DC control from the MRI system 1. The preamplifier capacitor 48 may be of any capacitance required to operate in parallel with the preamplifier's 70 internal input capacitance in order to shift the preamplifier 70 operating bandwidth to the second frequency, when the second frequency is close to the first frequency for the dual tuned resonator 10-1.

The reactance 46 alters input inductance to the preamplifier 70 when activated. The reactance 46 is activated when the switch 45 is closed, placing the reactance 46 in parallel with the preamplifier circuit inductor 44. When in parallel, the reactance 46 matches the negative reactance of the constant capacitor 43, which is parallel with and matches the variable capacitor 42 when the dual tuned resonator 10-1 has a resonant frequency at the second frequency. The reactance 46 may be any reactance (inductive of capacitive) that creates parallel reactance to match that of the combined negative reactance of variable capacitor 42 and constant capacitor 43 to create an isolation circuit to reduce undesired mutual coupling between dual tuned resonators.

The one or more preamplifier circuit switches 41, 45 and 47 activate and deactivate portions of the preamplifier circuit 40, simultaneously or nearly simultaneously. The switches 41, 45 and 47 may be any mechanism for activating and deactivating the portions of the preamplifier circuit 40, such as a single pole single throw switch (SPST), microelectromechanical system (MEMS) switch, pin diode, or voltage-controlled varactor such as previously described. When the switches 41, 45, and 47 are in an open position in this embodiment, portions of the preamplifier circuit 40 are deactivated, such that preamplifier circuit capacitor 42, reactance 46, and input capacitor 48 are disengaged, and the preamplifier circuit 40 has input impedance to match the center frequency of the preamplifier 70 at the first frequency.

When the switches 41, 45, and 47 are in a closed position portions of the preamplifier circuit 40 are activated, such that the preamplifier circuit capacitor 42, reactance 46, and input capacitor 48 are engaged. When the preamplifier circuit capacitor 42, reactance 46, and input capacitor 48 are engaged the center frequency of the preamplifier 70 shifts to match the center frequency of the second frequency, and the input impedance of the preamplifier circuit 40 matches the center frequency of preamplifier 70 at the second frequency.

The preamplifier 70 is configured to amplify both the first and second frequencies as well as match the output impedance of the dual tuned resonator 10-1 to the MR system receiver 13 of MR system 1 to within 5 ohms, where the MR system receiver 13 is approximately 50 ohms. The preamplifier 70 may match the output impedance in conjunction with the MR inductor 61 and output impedance circuit 60. The preamplifier 70 may be either a narrowband or broadband preamplifier. In the example embodiment illustrated in FIG. 3, the preamplifier 70 is a narrowband preamplifier. The preamplifier 70 may provide a gain of between 20 and 30 dB as required by the MRI system receiver 13 and operate using the DC voltage provided by the MRI system 1 on the connecting cable center pin (not pictured).

The MRI inductor 61 substantially matches (within 5 ohms) the output impedance from the preamplifier 70 to the MRI system 1. The MRI inductor 61 may be any inductance to substantially match the output impedance from the preamplifier 70 to the MRI system 1.

The output impedance circuit 60 matches the output impedance of the preamplifier 70 to the MRI system 1 to within 5 ohms when the dual tuned resonator 10-1 has a resonant frequency at the second frequency. The output impedance circuit 60 includes an output impedance capacitor 63, an output impedance inductor 64, and an output impedance switch 62.

The output impedance capacitor 63 is configured to provide a shift in output reactance in conjunction with the output impedance inductor 64 when activated. The output impedance capacitor 63 may be of any capacitance to offset the inherent shift of the preamplifier output reactance when the preamplifier 70 operates at the second frequency.

The output impedance inductor 64 provides a shift in output reactance in conjunction with the output impedance capacitor 63 when activated. The output impedance inductor 64 may be of any inductance to offset the inherent shift of the preamplifier output reactance when the preamplifier 70 operates at the second frequency.

The output impedance switch 62 activates and deactivates the output impedance circuit 60. The switch 62 may be any mechanism for activating and deactivating the portions of the preamplifier circuit 60, such as a single pole single throw switch (SPST), microelectromechanical system (MEMS) switch, pin diode, or voltage-controlled varactor. When the switch 62 is in an open position the output impedance circuit is deactivated, and the output impedance of the preamplifier 70 matches within 5 ohms to the MRI system 1 for the first frequency. When the switch 62 is in a closed position the output impedance circuit 60 is activated, and output impedance of the preamplifier 70 is shifted to match within 5 ohms the MRI system 1 for the second frequency.

Figure 4:
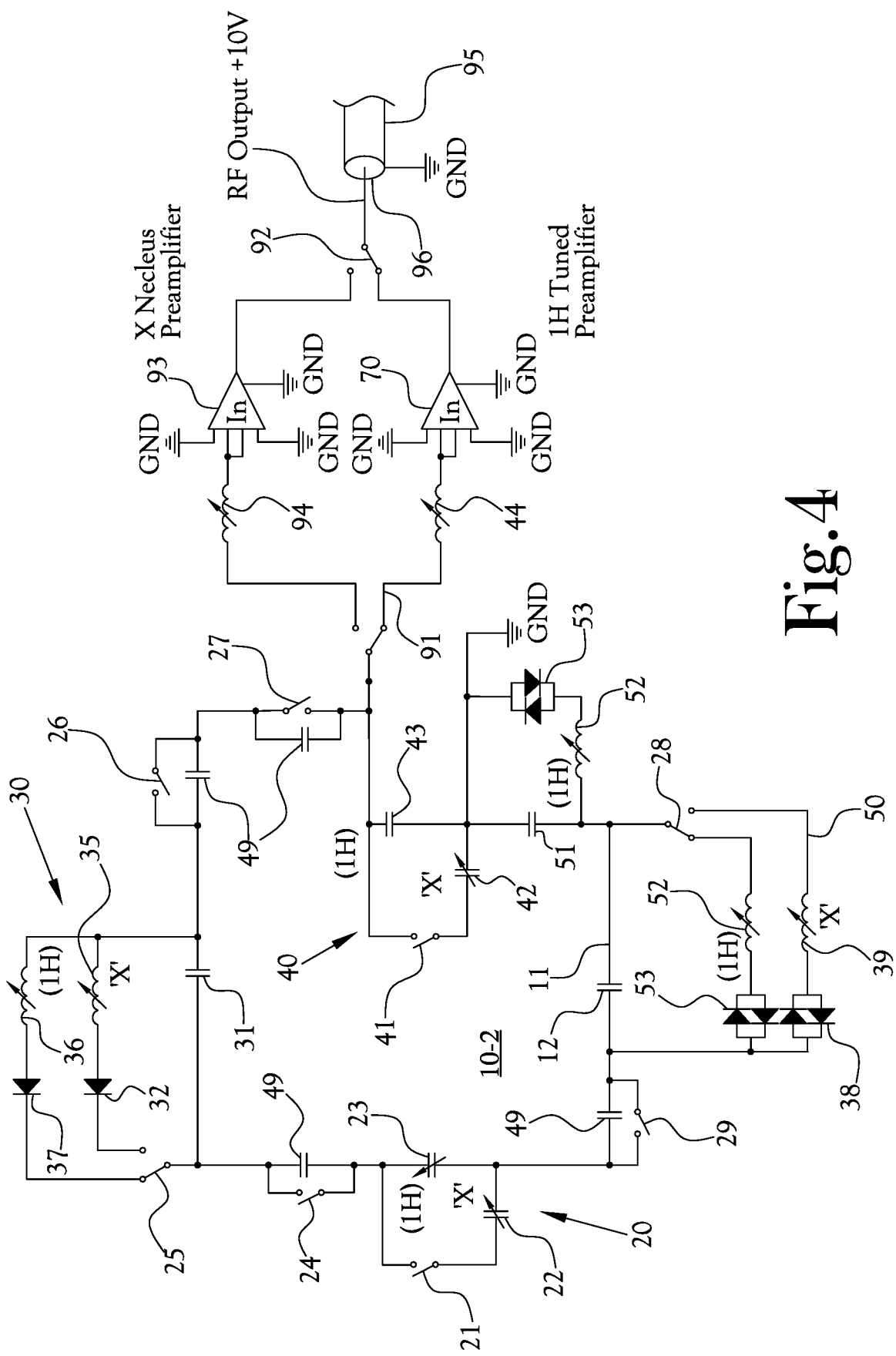
FIG. 4 illustrates a dual tuned resonator of a dual tuned receiver coil.

FIG. 4 illustrates a dual tuned resonator of a dual tuned receiver coil. In the example embodiment of FIG. 4, a dual tuned resonator 10-2 receives at least two frequencies that are far apart, such as, for example, over approximately 7%, or approximately 15%, apart, or at least not close together. The dual tuned resonator 10-2 includes the at least one constant capacitor 12, 31, 43, and 51, the at least one variable frequency circuit 20, the first frequency decoupler 50, the second frequency decoupler 30, and the preamplifier circuit 40. The dual tuned resonator 10-2 further includes one or more shorted capacitors 49, one or more shorting switches 24, 29, 26, and 27. The at least one constant capacitor 12, 31, 43, 49, and 51, are substantially the same as their corresponding elements in FIG. 2.

The at least one variable frequency circuit 20 shifts the resonance of the dual tuned resonator 10-2 to a second RF, such as approximately 15.0 MHz, which is the RF of Xenon. The at least one variable frequency circuit 20 includes a variable capacitor 22 and a switch 21. The variable capacitor 22 may be any capacitance to generate a resonant frequency of the second RF for the dual tuned resonator 10-2 when the variable frequency circuit 20 is activated. The switch 21 is substantially the same as the corresponding element of FIG. 2.

The first frequency decoupler 50 performs passive decoupling of the dual tuned resonator 10-2 when the dual tuned resonator 10-2 is transmitting the first frequency. The first frequency decoupler 50 may further perform passive decoupling of the second frequency when the two frequencies are far apart. The first frequency decoupler 50 generates a high impedance resonance circuit for the first frequency during the transmit cycle of the first frequency. The first frequency decoupler 50 includes a first frequency variable inductor 52, at least one constant capacitor, such as constant capacitor 12, and crossed PIN diodes 53 that are substantially the same as their corresponding components in FIG. 2.

The first frequency decoupler may further generate a high impedance resonance circuit for the second frequency during the transmit cycle of the second frequency. The first frequency decoupler may further include a variable inductor 39, crossed PIN diodes 38, and a first frequency decoupler switch 28 to generate the high impedance resonance circuit in substantially the same manner as the first frequency variable inductor 52 and first frequency crossed PIN diodes 53. Further, the dual tuned resonator 10-2 may include one or more redundant first frequency passive decouplers, as shown in FIG. 4 by constant capacitor 51, first frequency variable inductor 52, and first frequency crossed PIN diodes 53.

The first frequency decoupler switch 28 activates the appropriate crossed PIN diode and inductor to decouple the dual tuned resonator 10-2 when it is transmitting the first and second RF. The first frequency decoupler switch 28 may be a single pole double throw switch (SPDT) as further described in FIG. 5.

The second frequency decoupler 30 performs active decoupling of the dual tuned resonator 10-2 during transmission of the second frequency. The second frequency decoupler 30 may further perform active decoupling of the dual tuned resonator 10-2 during transmission of the first frequency. The second frequency decoupler 30 includes a second frequency variable inductor 35, at least one constant capacitor, such as constant capacitor 31, and an actively based diode 32. To actively decouple, a direct current (DC) control voltage generated by the MRI system 1, and synchronized with the transmit pulse timing, is connected across active diode 32 via separate control lines (not pictured). Therefore, the second frequency variable inductor 35 is configured to generate a high impedance resonance circuit with the constant capacitor 31 during transmission of the second frequency. The second frequency variable inductor 35 may be any inductance to generate the high impedance resonance circuit with capacitance of constant capacitor 31 when in parallel. Further, the second frequency variable inductor 35 may be actively switched into parallel circuit by the synchronization of the DC control voltage across the PIN diode 32.

Further, the second frequency decoupler 50 may perform active decoupling of the first frequency when the first frequency and second frequency are far apart. The second frequency decoupler 30 further includes a first frequency inductor 36, a first frequency PIN diode 37, and a second frequency decoupler switch 25. The first frequency inductor 36 is configured to generate a high impedance resonance circuit with the constant capacitor 31 during transmission of the first frequency. To actively decouple, a direct current (DC) control voltage generated by the MRI system 1, and synchronized with the transmit pulse timing, is connected across active diode 37 via separate control lines (not pictured). Therefore, the first frequency variable inductor 36 is configured to generate a high impedance resonance circuit with the constant capacitor 31 during transmission of the first frequency. The first frequency variable inductor 36 may be any inductance to generate the high impedance resonance circuit with capacitance of constant capacitor 31 when in parallel. Further, the first frequency variable inductor 36 may be actively switched into parallel circuit by the synchronization of the DC control voltage across the PIN diode 37.

The second frequency decoupler switch 25 activates the appropriate PIN diode and inductor to decouple the dual tuned resonator 10-2 when it is transmitting the first and second frequencies. The first frequency decoupler switch 25 may be a single pole double throw switch (SPDT) as further described in FIG. 5.

The one or more series capacitors 49 provide and detract capacitance from the dual tuned resonator 10-2 to shift resonance of the dual tuned resonator from the first to the second frequency. The one or more shorted capacitors 49 add capacitance to the dual tuned resonator 10-2 when in circuit with the dual tuned resonator 10-2. The one or more shorted capacitors 49 detract capacitance from the dual tuned resonator 10-2 when shorted out of the circuit of the dual tuned resonator 10-2. Shorting the one or more shorted capacitors 49 removes the capacitive junctions from the circuit, lowering total net capacitance, and thereby shifting frequency of the circuit lower.

The one or more shorting switches 24, 29, 26, and 27 short one or more constant capacitors 49. The shorting switches may be any mechanism for shorting the one or more shorted capacitors 49, such as a single pole single throw switch (SPST), microelectromechanical system (MEMS) switch, or a varactor or voltage-controlled PIN diode. When the shorting switches 24, 29, 26, and 27 are open, the one or more constant capacitors 49 are not shorted. When the shorting switches 24, 29, 26, and 27 are closed, the one or more constant capacitors 49 are shorted. The one or more shorting switches open and close simultaneously or nearly simultaneously. The one or more shorting switches 24, 29, 26, and 27 may be engaged by DC control via the MRI system 1.

The preamplifier circuit 40 is configured to develop the MRI signal of the dual tuned resonator 10-2 to a preamplifier 70 when the dual tuned resonator 10-2 resonates at a first frequency. The preamplifier circuit 40 may further be configured to develop the MRI signal of the dual tuned resonator 10-2 to a preamplifier 93 when the dual tuned resonator 10-2 resonates at a second frequency. The preamplifier circuit 40 includes a preamplifier circuit inductor 44, a preamplifier 70, and at least one constant capacitor, such as constant capacitor 43. The preamplifier circuit inductor 44, the preamplifier 70 and the constant capacitor 43 are substantially similar to their corresponding elements in FIG. 3.

The preamplifier circuit 40 further includes a second preamplifier circuit inductor 94, and the second frequency preamplifier 93. The second preamplifier circuit inductor 94 and the second frequency preamplifier 93 operate substantially similar to the preamplifier circuit inductor 44 and the preamplifier 7 when the dual tuned resonator 10-2 resonates at the second frequency. The preamplifier circuit 40 further includes one or more SPDT preamplifier switches 91 and 92. The one more SPDT switches 91 and 92 are configured to activate or deactivate the preamplifier 70 and the second frequency preamplifier 93 in circuit with the dual tuned resonator 10-2 and system cable 95 of the MRI system 1 via the center pin 96 for signal transfer. The SPDT switches 91 and 92 may be a single pole double throw switch (SPDT) as further described in FIG. 5. The SPDT switches 91 and 92 may operate simultaneously or nearly simultaneously with the decoupler switches 25 and 28, and the one or more shorting switches 24, 29, 26, and 27. The SPDT switches 91 and 92 may be engaged by DC control via the MRI system 1.

Figure 5:
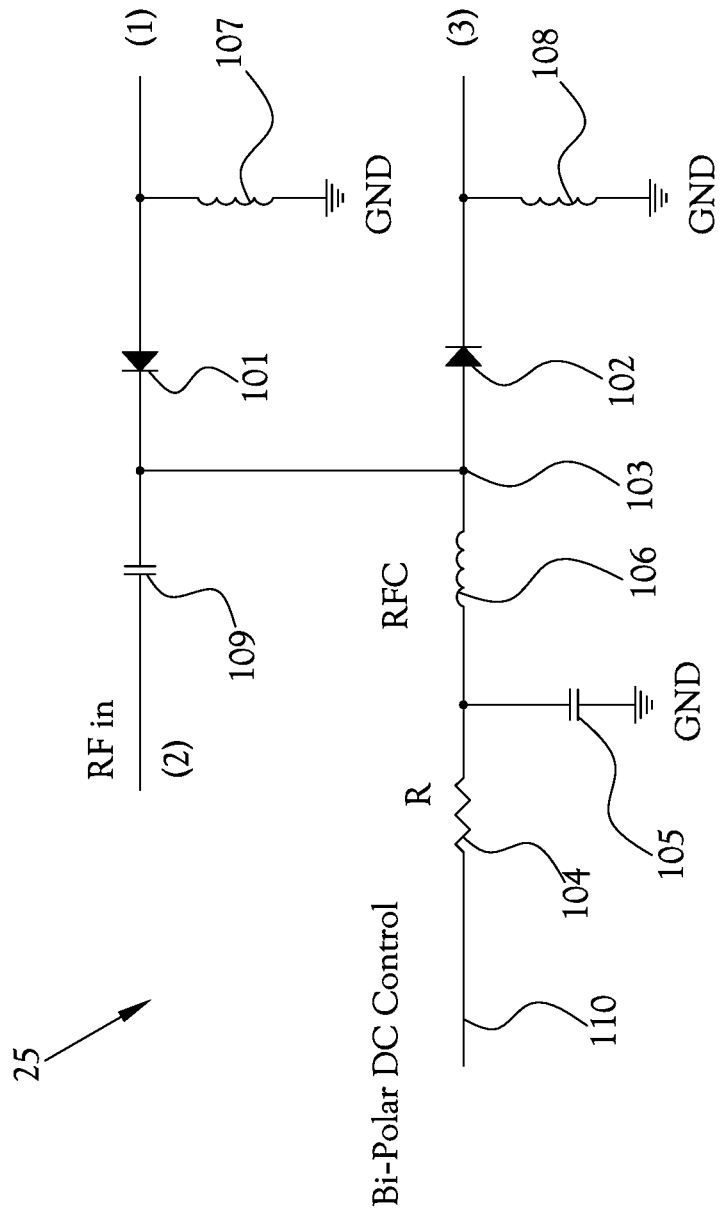
FIG. 5 illustrates an example of a single pole double throw (SPDT) switch used in various examples.

FIG. 5 illustrates a single pole double throw (SPDT) switch useful in the presently described system. The example in FIG. 5 has a configuration that may be indicative of one or more of the SPDT switches described herein. The SPDT switch 25 utilizes PIN diodes 101 and 102 with a common node 103. A control DC signal enters via connection 110, and current is limited through resistor 104. Frequency is filtered by capacitor 105 and RF choke 106. These latter components prevent interference of the low impedance DC circuit with the RF circuit at node 103 where the common RF signal is passed to common node (2) through capacitor 109. Choke 106 offers a high impedance to RF and low resistance to DC, while capacitor 105 effectively shorts any RF signals to ground, to prevent them from entering into the DC bias path 110.

When the bipolar control signal from the MRI system at 110 is positive with respect to ground, diode 102 is forward biased with its cathode connection to ground via RF choke 108, thus enabling the RF signal to pass with limited impedance from switch node (2) to node (3). Positive voltage at 103 also reverse biases diode 101 effectively ensuring good isolation between the two ports at node (2) and (3). Similarly, when the bipolar control signal from the MRI system at 110 is negative with respect to ground, diode 101 is forward biased with its node connection to ground via RF choke 107 to enable the RF signal to pass with limited impedance from switch node (2) to node (1). Negative voltage at 103 also reverse biases diode 102 similarly ensuring good isolation between the two ports at node (2) and (3) while operating in this mode.

FIG. 6 illustrates a second frequency transmit coil of a dual tuned coil package. As previously described, this example embodiment of the second frequency transmit coil 17a transmits at a second frequency relative to a first frequency transmitted by the system body coil, or first frequency transmit coil. Various example embodiments of the second frequency transmit coil 17a may further be configured to transmit two or more frequencies. In the example embodiment illustrated in FIG. 6, the second frequency transmit coil 17a may include one or more balanced resonators 130 and 140, one or more DC blocking diodes 123 and 125, a high voltage PIN diode 124, a series match capacitor 126, and a parallel match capacitor 127. It may be beneficial to configure the components such that the parallel drive resonators are balanced in order to provide more efficient transmit power distribution of the MRI power from the MRI system 1, due to quadrupling the drive currents around a parallel circuit compared to a series circuit given the same reactances in each resonator and a common input impedance. The MRI system 1 delivers the excitation signal from the second frequency power amplifier 16b via MRI system 1 local transmit coil port 9 through a cable 121.

The one or more balanced resonators 130 and 140 may be of a shape to proximately fit and image a particular anatomy of a patient, such as the patient's lungs. The balanced resonator 130 may include one more diodes 131, 133 and 136, an adjustable capacitor 132, a fixed capacitor 135, one or more series capacitors 134, and one or more shorting circuits 150. The balanced resonator 140 may include one or more diodes 141, 143 and 146, an adjustable capacitor 142, a fixed capacitor 145, one or more series capacitors 144, and one or more shorting circuits 160.

When the high voltage PIN diode 124 is forward biased, the match capacitor 126 is in series with the input signal from the MRI system 1. The parallel match capacitor 127 is in parallel to the input signal from the MRI system 1.

During transmission of the second frequency signal to the transmit coil 17a via the cable 121, the DC control signals from the MRI system 1 heavily biases on the one or more diodes 131, 133, 136, 141, 143, 146, and the high voltage PIN diode 124. During transmission of the first frequency signal and receiving by the receiver coil 18, the bi-polar control signal of MRI system 1 reverse biases the diodes 131, 133, 136, 141, 143, 146, and the high voltage PIN diode 124. Biasing makes the one or more balanced resonators 130 and 140 break into several shorter conductor lengths, due to reverse biased diodes acting like open circuits. This makes the transmit coil 17a transparent to both the first frequency transmit coil 17b of the MRI system 1, and the receiver coil 18, which decreases interference of coupling between these devices.

The second frequency signal to the transmit coil 17a may be transmitted via the cable 121 is delivered across capacitor 127, and the voltage developed drives second frequency currents around the one or more balanced resonators 130 and 140 in phase and with equal magnitude due to the total impedance and resonant frequency of the one or more balanced resonators 130 and 140 being substantially equal. These impedances and frequencies are equal due to the fixed capacitor 135 being substantially equal to the fixed capacitor 145, and the series capacitor 134 being substantially equal to the series capacitor 144, with the adjustable capacitors 132 and 142 tuned to ensure balance (e.g., absolute balance) of currents while maintaining resonance at the second frequency.

The shorting circuits 150 and 160 are configured so that the transmit coil 17a transmits two or more frequencies. Each balanced resonator 130 and 140 may be balanced with equal capacitance values as previously described, such that one or more series capacitors, such as 134 and 144, may be shorted, via the shorting circuit 150 and 160 via switches 151 and 161. When the switches 151 and 161 are closed, capacitors 134 and 144 are shorted, which effectively increases the frequency of the resonator 17a. The switches 151 and 161 are opened and closed via control signals from the MRI system 1 via the local transmit coil port 9 and MR scanner receiver coil port 14. Capacitor selection, combined with one or more switches 151 and 161, may create two or more resonant frequencies for the second frequency transmit coil 17a, while maintaining balance between balanced resonators 130 and 140.

As previously described, the dual tuned receiver coil 18 may be provided with multiple resonators, such as, for example, 8 resonators, 16 resonators, and so on. The purpose of the multiple resonators is to provide improved signal quality, from a target tissue volume, compared to fewer larger resonators. These multiple resonators may be connected to independent MRI system receiver channels which further amplify, analog-to-digital convert, and image process. Further, due to more modern and advanced digital signal image acquisition and processing techniques such as parallel imaging, these multiple resonator signals can be acquired much faster than those of fewer resonators, and, hence, significantly improving the temporal response of the MRI system, and enabling the imaging of rapid biological functions such as beating hearts and respiration.

Figure 7:
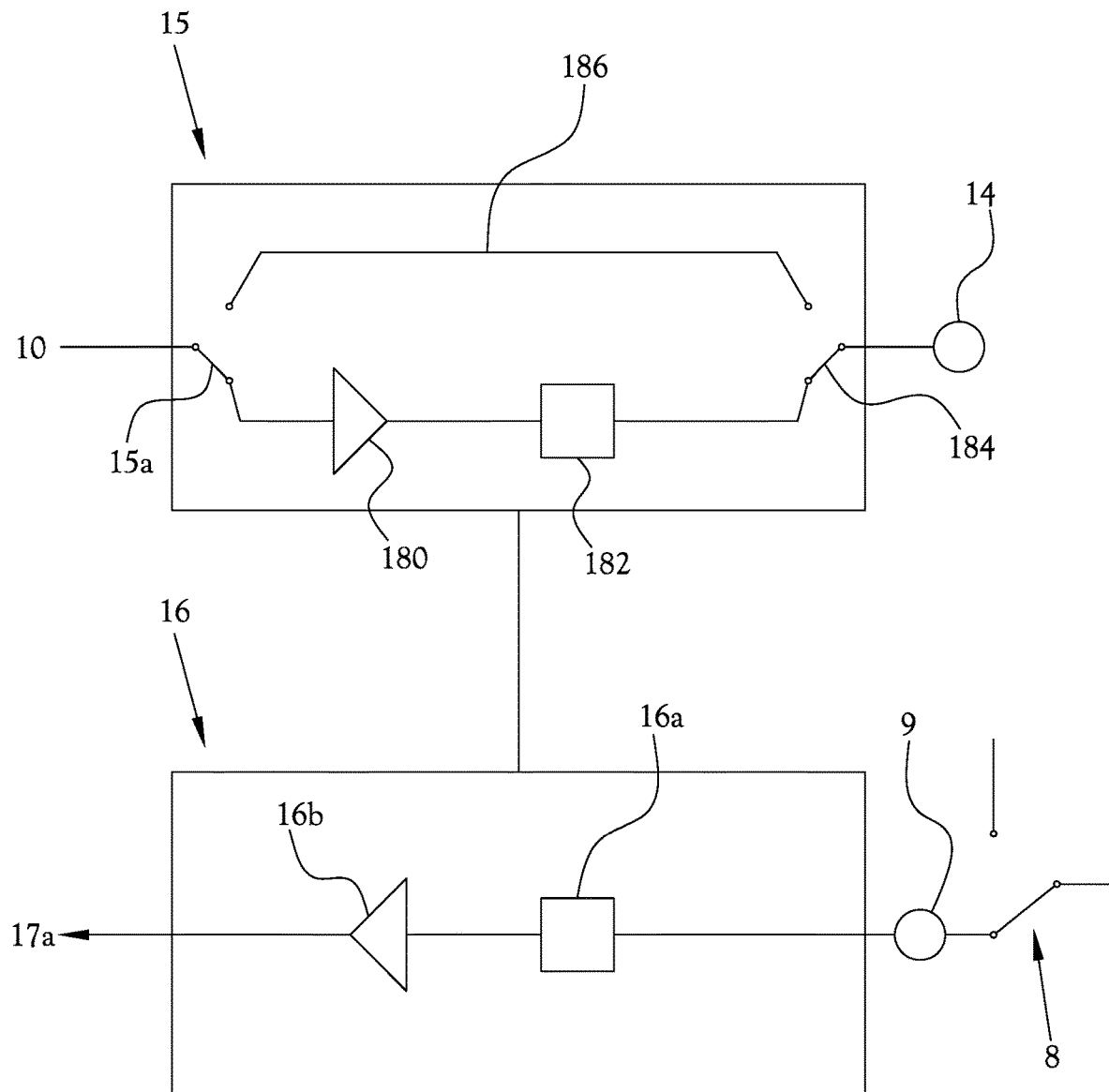
FIG. 7 illustrates the switchable receiver and frequency converter of FIG. 1.

FIG. 7 illustrates the switchable receiver and frequency converter of FIG. 1. As illustrated in FIG. 7, the frequency converter 16 includes frequency conversion logic 16a and a second frequency power amplifier 16b. A transmit power signal transmitted from the transmit power amplifier 6, and having the first frequency, may be transmitted in the same manner whether it is destined for the system body coil 17b or the second frequency transmit coil 17a, and the frequency switch assembly 8a is controlled to route the transmit power signal to one or the other. If the switch assembly 8a is controlled to route the transmit power signal through the local transmit coil port 9, the signal is received by the frequency conversion logic 16a to be converted from the first frequency to the second frequency. After converting the first frequency signal to the second frequency, the frequency conversion logic 16a sends the second frequency signal to the second frequency power amplifier 16 to be amplified and transmitted to the second frequency transmit coil 17a. The transmit power signal is typically applied to the transmit coils in pulses. After the second frequency transmit coil 17a has received and transmitted the second frequency power signal, the signal from the one or more dual tuned resonators 10 is received by the switchable receiver 15. If the signal received from the one or more dual tuned resonators 10 is transmitted at the second frequency, the switch 15a is controlled to route the received signal to an amplifier 180, and the amplified signal is then passed to frequency converter logic 182 to be converted back to the first frequency and then transmitted through switch 184 to the scanner receiver coil port 14. If the signal received by the switchable receiver has the first frequency, switches 15a and 184 are controlled to route the receive signal via line 186 through to the scanner receiver coil port 14 without the amplification and frequency conversion. Switches 15a and 184 may be controlled by a common control signals, one per channel and fully synchronized in their bi-polar switching, such that both switches are routing signals to/from the same line provided in the switchable receiver 15. It is noted that the two, switchable path configuration and associated componentry is illustrated in FIG. 7 only for the sake of clarity, but other variants of the switchable receiver 15 may have multiple paths to accommodate signals transmitted from a number of dual tuned resonators 10 of the dual tuned receiver coil. For example, the switchable receiver 15 may be configured with 16 such input and output paths so that each of 16 or fewer signals transmitted from the dual tuned receiver coil 18 to the switchable receiver 15 may be accommodated with paths switchable between the unaltered signal line and the amplified and frequency converted signal line. The receiver coil port 14 typically will be equipped to receive such a multiple number of lines as well, and the control logic for activating the lines received by the receiver coil port 14 may also be utilized as the switch control to control one or both of switches 15a and 184 to direct the signals from the resonators 10 to the receiver coil port 14.

Because most anatomically specific antenna include unique features such as number of resonators, power requirements, and output capabilities, they are accompanied by unique software codes, known as configuration files, which are routinely installed on the MRI system via simple editing of the MRI coil configuration via the console and computer. When the antenna in question is connected to the MRI system via ports 9 and/or 14, it is detected by the system program via unique identifying signals designed into the coil (such as programmable serial ID codes or resistor values), the system then pulls in the appropriate coil configuration file and utilizes it to drive the system controller 4 and thus provide control signals via the system receiver 13 and transmit power amplifier 6.

Thus, the signal received by the receiver coil port 14 of the MRI system 1 has the same frequency as that transmitted out from the local transmit coil port 9 of the MRI system 1. In various example embodiments of the present general inventive concept, the switchable receiver 15 and the frequency converter 16 may be in electrical communication and/operative control to cause the transmitted and received signals to be synchronized and in phase. Various example embodiments of the present general inventive concept provide such phase locking by a phase lock loop provided to one or both of the switchable receiver 15 and frequency converter 16, examples of which will be discussed in more detail in FIGS. 8 and 9. The switchable receiver 15 and frequency converter may be provided in separate housings or a common housing with a plurality of connections and/or connection ports to connect to the MRI system 1 ports and the second frequency transmit coil 17a. Therefore, various examples of the present general inventive concept provide a switchable receiver 15 and frequency converter 16 that may simply be plugged into the existing ports of an MRI system to convert a first frequency signal to a second frequency to be transmitted from the transmit coils and received by the receiver coils, and converted back to the first frequency such that the MRI system performs imaging as it normally would through the transmission and receipt of the first frequency signal throughout the entirety of the transmit and receive processes.

Figure 8:
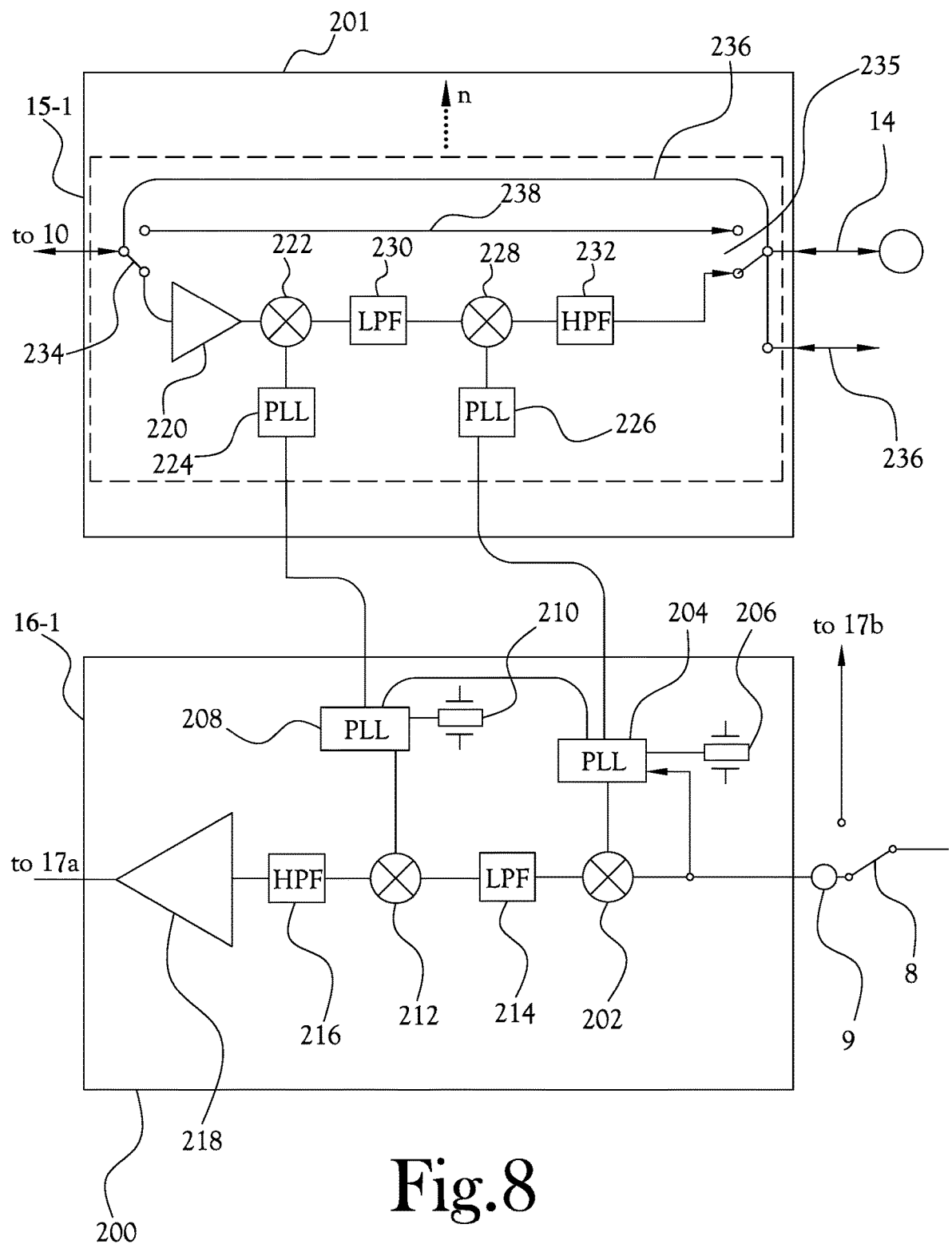
FIG. 8 illustrates a switchable receiver and frequency converter.

FIG. 8 illustrates a switchable receiver and frequency converter. As noted with the other various example embodiments discussed and/or illustrated herein, the present general inventive concept is not limited to the components illustrated in this example embodiment, as other example embodiments may be provided with more, fewer, and/or different componentry without departing from the spirit and scope of the present general inventive concept. For example, although the switchable receiver 15-1 and frequency converter 16-1 in FIG. 8 are provided in separate housings in electrical communication with one another, other examples may provide these or similar components in a common housing. In the example of FIG. 8, and as discussed in the description of FIG. 1, the switch assembly 8 is in electrical communication with the transmit power amplifier 6 and is configured to route the signal from the transmit power amplifier 6 either to the local transmit coil port 9 or along the MRI system 1 wiring connected to the first frequency transmit coil 17b. As previously described, the transmit power signal routed through the local transmit coil port will be delivered in this example to the frequency converter 16-1 to be converted to another frequency. The switch assembly 8 may typically be configured as part of the existing MRI system to allow an operator to selectively switch between routing the signal so as to transmit with the existing system body coil, referenced herein as the first frequency transmit coil 17b, or to transmit through the local transmit coil port which in this example embodiment is connected the frequency converter to be ultimately transmitted at a different frequency to a local coil, which is a coil that is inserted into the scanner and onto the patient, referenced herein as the second frequency coil 17a. Such a local coil could be placed over, for example, the patient's brain, elbow, knee, etc., and is a transmit as well as a receive coil. In the example embodiments described herein, portions of the local coil are typically differentiated between the second frequency coil 17a and the dual tuned receiver coil 18.

In the example embodiment illustrated in FIG. 8, the switch assembly 8 is illustrated as being in position to route the signal from the transmit power amplifier 6 through the local transmit coil port to the frequency converter 16-1. The signal frequencies discussed regarding this example are related to a 3 Tesla operating frequency of a conventional MRI system. Other MRI systems may be based on larger or smaller operating frequencies, for which the frequencies produced in the frequency converter 16-1 may be adjusted accordingly. For example, in the 3 Tesla operating frequency, the system delivers a signal of 123.2 MHz from the transmit power amplifier 6 as the hydrogen excitation frequency, which may be referred to herein as the hydrogen signal. The hydrogen signal coming into the frequency converter 16-1 during the transmit pulse, which is a synchronized activity in which the synchronization is done by the existing MRI system 1, is routed, or being sampled, from the local transmit coil port 9. In the example embodiment illustrated in FIG. 8, the hydrogen signal will be converted to a fluorine signal, or fluorine excitation frequency, which is 115.9 MHz for this MRI system. Because the hydrogen signal is relatively close to the fluorine signal, the transmit power signal for hydrogen excitation will be stepped down by a large amount before being stepped back up to a level for fluorine excitation. Changing the signal frequency in two stages in this manner may be better for input and output signal frequencies of relatively close values, but in various examples, the frequency converter 16-1 may be configured to operate in a single stage, as will be discussed in regard to FIG. 9.

The frequency converter 16-1 includes a first mixer 202 to receive the hydrogen signal from the local transmit coil port 9, and a first phase lock loop (PLL) 204 that also receives the hydrogen signal. The first PLL 204 includes a local crystal oscillator 206 as a reference oscillator producing a signal of 87.2 MHz. The first PLL 204 performs phase comparisons of the local oscillator 206 signal and the hydrogen signal and keep the two signals locked in phase, and supply the 87.2 MHz signal to the first mixer 202 such that the 87.2 MHz signal is synchronized and in phase with the 123.2 MHz hydrogen signal also supplied to the first mixer 202. The first mixer 202 receives the hydrogen signal and the signal from the first PLL 204 and generates a signal having an intermediate frequency of 36 MHz by subtracting the signal from the first PLL 204 from the hydrogen signal. The signal output from the first mixer 202 is then passed through a low pass filter 214 that rejects any higher frequency signal components from the first mixer 202 and allows the 36 MHz signal to pass through to a second mixer 212. A second PLL 208, which includes a local crystal oscillator 210 as a reference oscillator producing a signal of 80 MHz, is in electrical communication with the first PLL 204 and the second mixer 212 such that an 80 MHz signal provided to the second mixer 212 is synchronized and in phase with the 36 MHz intermediate frequency signal passed to the second mixer 212 from the low pass filter 214. The second mixer 212 receives the 36 MHz intermediate frequency signal and the 80 MHz signal from the second PLL 208 and generate the 115.9 MHz signal, which is the fluorine excitation frequency, by adding the intermediate frequency signal to the signal from the second PLL 208. The 115.9 MHz signal is passed through a high pass filter 216 that rejects any lower frequency signal components from the second mixer 212 and allows the 115.9 MHz fluorine signal to pass through to a power amplifier 218. The power amplifier 218 amplifies the fluorine signal to a desired level and transmits the amplified fluorine signal to the second frequency transmit coil 17a. The power amplifier 218 may have a several hundred Watt output. In various example embodiments of the present general inventive concept, because the MRI system employs an automated transmit gain setting based upon receiving the peak signal return relative to adjusting transmit power settings (thus finding the 90 degree flip angle), the power amplifier 218 may be set to scale the power out according to input power from the local coil transmit port 9 of the system, thus continuing to employ the auto-gain setting routine of the MRI system. As previously noted, the two-stage mixer configuration is used in this example due to the relatively close frequencies of the hydrogen and fluorine signals. In this example, relatively high frequency local oscillators 206,210 are used to produce an intermediate frequency signal that is significantly lower in frequency than the hydrogen and fluorine signals. Such a configuration reduces the chances of having one signal corrupt the other in a single-stage mixer and filter configuration due to the signals being so relatively close to one another.

The components of the frequency converter 16-1 illustrated in FIG. 8, as well as a housing 200 containing the illustrated components, are preferably non-magnetic, because the frequency converter 16-1 may be formed of sufficient size and dimension to be placed inside the bore of the MRI and plugged directly into the local transmit coil port 9 of the MRI system 1. The device may have no ferromagnetic material at all, having a casing of plastic or aluminum or other such non-magnetic material, and be constructed of all non-magnetic parts. Similarly, the switchable receiver 15-1 may include a housing 201 containing the illustrated components therein, the housing 201 and components also being formed of non-magnetic material so as to be placed in close proximity to the scanner receiver coil port 14 of the MRI system. The frequency converter 16-1 and switchable receiver 15-1 may be provided in a common housing and separated by one or more shielding layers and/or materials, as the local transmit coil port 9 and receiver coil port 14 are typically located in close proximity to one another. In various examples in which the frequency converter 16-1 and switchable receiver 15-1 are provided in separate housings 200,201, electrical connection ports may be provided so that one or more oscillators may be shared by the components in both housings 200,201.

The output of the frequency converter 16-1 is the converted frequency of sufficient power to drive the second frequency coil 17a, while the transmit power signal from the transmit power amplifier 6 was switched to the local transmit coil port 9 using the same switching logic that would otherwise be employed by the MRI system 1. The transmit power signal was switched, or converted, to operate at the non-hydrogen frequency, which in this example is 115.9 MHz, the fluorine frequency. Thus, the existing MRI system 1 is essentially unaware of the change in the transmit power path and transmit power frequency after the signal has gone through the local transmit coil port 9.

The switchable receiver 15-1 of the example illustrated in FIG. 8 is switchable between a first path that receives a signal from the resonators tuned to the transmit power signal delivered to the first frequency transmit coil 17b, and a second path that receives a signal from the resonators tuned to the transmit power signal delivered from the frequency converter 16-1 to the second frequency transmit coil 17a. As the signal received through the resonators 10 from the frequency converter 16-1 is at a different frequency than that output at the local transmit coil port 9, the switchable receiver 15-1 converts the frequency of the received signal back to the frequency of the transmit power signal delivered from the local transmit coil port 9. In the example of FIG. 8, the frequency converter 16-1 is transmitting at 115.9 MHz, and therefore the signal received from the respective resonators of the dual tuned resonators 10 will also be at a frequency of 115.9 MHz, which is the fluorine frequency. The frequency converter 16-1 is a single channel system driving a transmit power signal, which could be implemented in various examples as a coaxial output. The switchable receiver 15-1, however, uses low power, using an n-channel multi-nuclear coil as previously described in regard to the dual tuned resonators 10. For example, if there are 8 resonators provided for the second frequency signal, e.g., the fluorine signal, in the receiver coil array 10, then 8 channels will be provided to receive those respective signals from the 8 resonators, and so on. Each of those n channels are configured to be switchable at an input of the switchable receiver 15-1 between the unaltered path for the first frequency signal, e.g., the hydrogen signal, and the frequency conversion path for the second frequency signal, e.g., the fluorine signal. Each of the n channels are also configured to be switchable at the output of the switchable receiver 15-1 to deliver a signal having the first signal frequency level to the MRI scanner receiver coil port 14. For the sake of clarity, only one of the n channels is illustrated for the example embodiment of FIG. 8.

For each of the n channels of the switchable receiver 15-1, the respective signals from the dual tuned resonators 10 are received at the switch 234, which is controlled by the existing switching logic provided in the MRI system for the receiver coil port 14, indicated in FIG. 8 by the line 236. Typically, the MRI systems having multi-channel systems have receiver (input) coil ports 14 having paths for all the different RF pathways controlled by logic pins driving a TTL type of logic to engage and disengage the receiver elements or resonators according to whether the system is in a receive or transmit pulse of the cycle. Therefore, in the receive pulse the logic pins are controlled to make the receiver coil ports 14 on and operable to receive the respective signals from the resonators 10. The independent DC output from the receive coil port 14 is used to control coil detuning during an input pulse, to activate diodes in the resonators 10 to detune and decouple resonator logic to change frequencies, and so on. Thus, the same logic coming from the MRI system that is synchronized with the transmit/receive toggling may also be used to drive the switches 234,235 to toggle between, for example, the hydrogen and fluorine modes described herein. If the transmit system is operating in the hydrogen mode, the receiver array is also operating in the hydrogen mode, and the signal does not need to be altered by the switchable receiver 15-1. In such a case, the switches 234,235 illustrated in the switchable receiver 15-1 in FIG. 8 would be in the opposite state to that illustrated so as to connect to line 238, and the hydrogen signals would pass straight through to the MRI system receiver coil port 14 to be processed as normal. Alternatively, when the switches of the switchable receiver 15-1 are in the state illustrated in FIG. 8, in the non-hydrogen mode, the 115.9 MHz signal delivered from the resonators 10 are directed to an amplifier 220. Although the 115.9 MHz signal has already been amplified by an onboard amplifier out in the dual tuned receiver coil 18 as previously described, the signal is still relatively small due to the fact that MRI coils work with very small signals. Thus, the signals are driven by a preliminary second stage provided by the amplifier 220 before being converted back to the first frequency. In various example embodiments of the present general inventive concept, the gain of the amplifier 220 may be set to compensate for the losses of the converter circuitry, and to deliver the same signal amplitude back to the receiver coil port 14 as the hydrogen signal, i.e., the first frequency, switched directly through.

The switchable receiver 15-1 includes first and second PLLs 224,226 that are configured to be in electrical communication with the frequency converter 16-1. More specifically, in the example embodiment illustrated in FIG. 8 the switchable receiver 15-1 includes a first PLL 224 in electrical communication with the second PLL 208 of the frequency converter 16-1, and a second PLL 226 in electrical communication with the first PLL 204 of the frequency converter 16-1. This electrical communication allows the PLLs 224,226 of the switchable receiver 15-1 to share the respective outputs of the local oscillators 210,206 of the PLLs 204,208 of the frequency converter 16-1 in phase lock loop control. The local oscillators may be configured in either of the switchable receiver 15-1 or frequency converter 16-1. The 115.9 MHz signal output from the amplifier 220 is received by a first mixer 222 that also receives an 80 MHz signal from the first PLL 224 that is synchronized and in phase with the 115.9 MHz signal from the amplifier 220. The first mixer 222 is configured to down convert the 115.9 MHz signal to the same 36 MHz intermediate frequency produced in the frequency converter 16-1 by subtracting the signal from the first PLL 224 from the signal received from the amplifier 220. The generated signal output from the first mixer 222 is then passed through a low pass filter 230 that rejects any higher frequency signal components from the first mixer 222 and allows the 36 MHz signal to pass through to a second mixer 228, which is in electrical communication with the second PLL 226 to receive the 87.2 MH signal that is synchronized and in phase with the 36 MHz signal received from the low pass filter 230. The second mixer 212 receives the 36 MHz intermediate frequency signal and the 87.2 MHz signal from the second PLL 226 and generates a 123.2 MHz signal by adding the 36 MHz signal to the 87.2 MHz signal from the second PLL 226. The 123.2 MHz signal is passed through a high pass filter 232 that rejects any lower frequency signal components from the second mixer 228 and allows the 123.2 MHz signal to pass through to be output by the switchable receiver 15-1 at the same frequency level as the transmit power signal originally output at the local transmit coil port 9. Through such a conversion, the MRI system 1 is not "aware" of the change in the transmit power signal frequency generated in the frequency converter 16-1 and applied to the second frequency transmit coil 17*a*, because the MRI system 1 is receiving signals at the same frequency at which the signals were transmitted. One valuable aspect of this construction is the ability to utilize all of the MRI system's existing features in operational capability, but being able to obtain information at a different resonant frequency, on both the transmit and receive sides of the MRI system. A transmitted power signal frequency can be translated to the nuclei of interest, and the frequency can be translated again after receiving the signal back from the coil package, and the MRI system will process the information as if it were the hydrogen signal frequency. It is noted that while the fluorine nuclei frequency is discussed throughout the description of the example embodiment illustrated in FIG. 8, different examples of the system can be configured to generate the resonant frequency for a host of other elements, such as calcium, phosphorous, sodium, and the like.

As previously discussed, the two-stage frequency conversion illustrated in the example of FIG. 8 may be desirable when the transmit power signal frequency of the MRI system and the desired transmit power signal frequency have relatively close values. In various examples where the desired transmit power signal frequency is much higher or lower than the transmit power signal frequency natively generated by the MRI system, a single-stage frequency conversion will likely be sufficient. As such, a single local oscillator may suffice for such an example embodiment, and a single PLL in each of the switchable power amplifier and switchable receiver.

Figure 9:
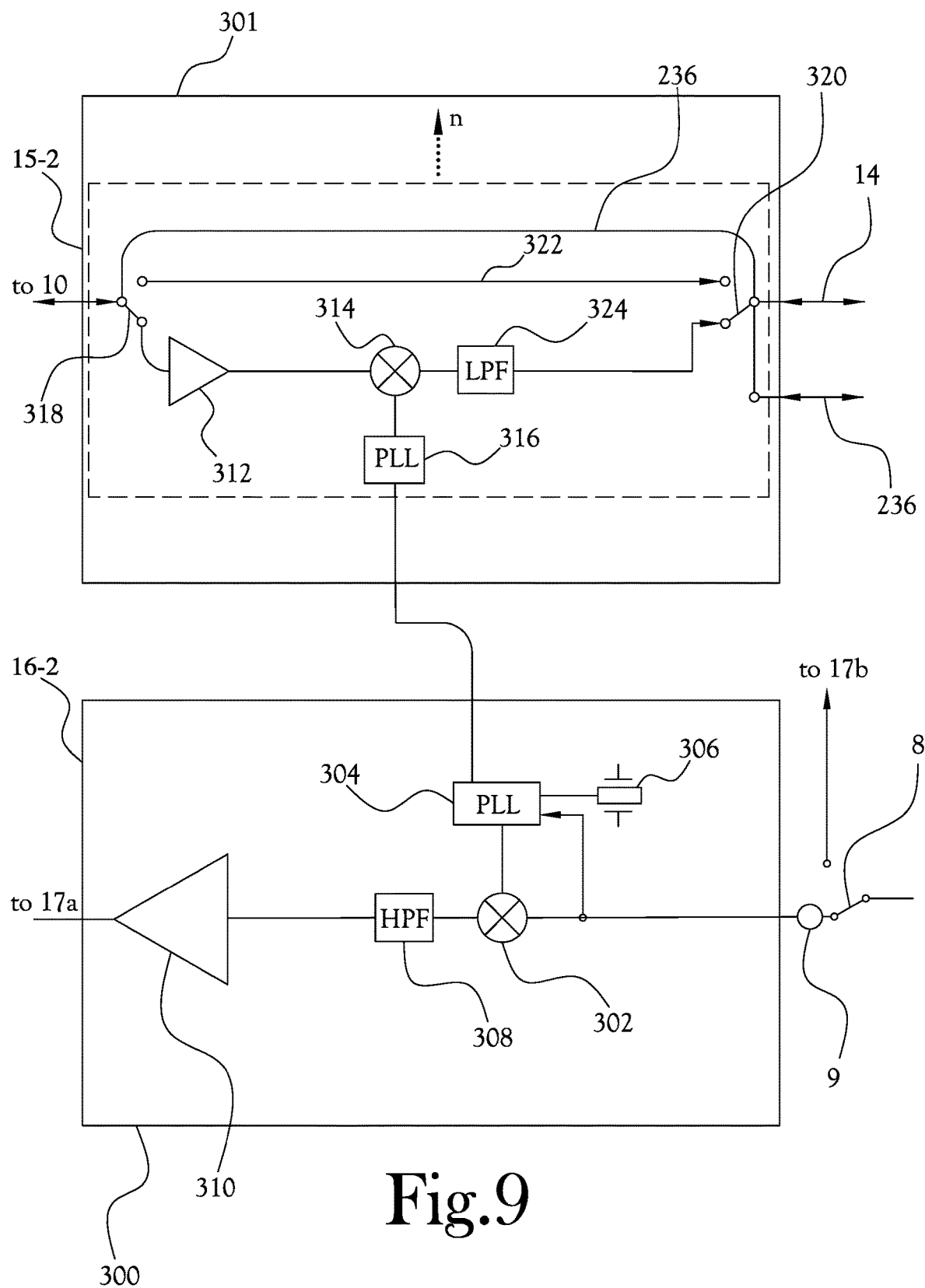
FIG. 9 illustrates a switchable receiver and frequency converter.

FIG. 9 illustrates a switchable receiver and frequency converter. The overall configuration of the example of FIG. 9 is similar to that illustrated in FIG. 8, except that the frequency conversion from the first frequency to the second frequency, as well as the conversion from the second frequency back to the first frequency, is performed in a single-stage, rather than a two-stage, operation. In various examples in which the second frequency is very different (for example, more than 7%, or 15% apart) from the first frequency, e.g., 15 MHz to 120 MHz apart, such a single-stage frequency conversion may be more acceptable. In FIG. 9, a 1.5 Tesla operational MRI system is assumed, and thus the frequency converter 16-2 converts a first frequency of 64 MHz, which is the hydrogen signal for this system, to a second frequency of 30 MHz, which is the phosphorous signal for this system. Thus, the frequency converter 16-2 and switchable receiver 15-2 are operable with a dual tuned receiver coil that detects phosphorous nuclei as well as hydrogen nuclei. Other than the single-stage frequency conversion, the switchable receiver 15-2 and the frequency converter 16-2 operate in roughly the same manner as the switchable receiver 15-1 and the converter 16-1 of FIG. 8. In this example, the switch assembly 8 is controlled by the MRI system 1 to route the hydrogen signal through the port 9, which is therefore delivered to a mixer 302, as well as to a PLL 304 including a local crystal oscillator 306 as a reference oscillator producing a signal of approximately 34 MHz. The PLL 304 performs phase comparisons of the local oscillator 306 signal and the hydrogen signal and keeps the two signals locked in phase, and supplies the 34 MHz signal to the mixer 302 such that the 34 MHz signal is synchronized and in phase with the 64 MHz hydrogen signal also supplied to the mixer 302. The mixer 302 receives the hydrogen signal and the signal from the first PLL 204 and generates a signal having an intermediate frequency of 30 MHz by subtracting the signal from the PLL 304 from the hydrogen signal. The signal output from the mixer 302 is then passed through a high pass filter 308 that rejects any higher frequency signal components from the mixer 302 and allows the 30 MHz signal to pass through to an amplifier 310. The amplifier 310 amplifies and transmits the second frequency signal to the second frequency transmit coil 17a. The gain of the amplifier 310 may be set to compensate for the losses of the converter circuitry, and to deliver the same signal amplitude as the first frequency output from the local coil transmit port 9. When the switchable receiver 15-2 receives a signal back from the resonators 10 at the second frequency, a switch 318 is controlled to pass the signal to an amplifier 312 to amplify and transmit the second frequency signal to a mixer 314. The gain of the amplifier 312 may be set to compensate for various encountered losses and to deliver the same signal amplitude back to the mixer 314 as the hydrogen signal, i.e., the first frequency, that would be switched directly through line 322 of the switchable receiver 15-2.

The mixer 314 is in electrical communication with a PLL 316 that is also in electrical communication with the PLL 304 so as to receive the 34 MHz signal that is synchronized and in phase with the second frequency signal. The mixer 314 adds the signals together to transmit the 64 MHz, or first frequency, signal to a low pass filter 324 that rejects any lower frequency signal components from the mixer 314 and passes the first frequency signal to the switch 320, which in FIG. 9 is controlled to pass the first frequency signal on to the receiver coil port 14. It is noted that various examples may have more or less components as those illustrated in FIG. 6, and/or in a different configuration, and may include altogether different components.

A method of operating MRI systems at one or more switchable frequencies different than that generated and generally transmitted to the body system coil of the MRI system is provided. One goal is to provide a relatively low-cost upgrade or addition to existing MRI systems which will provide for the excitation and reception of MRI signals from more than one nuclei, in addition to that of hydrogen. Referring to FIG. 1, at least one aspect of such an upgrade is that it may utilize only the common connectivity ports, i.e., the local transmit coil port 9 and scanner receiver coil port 14, provided by all MRI system manufacturers for the substitution of various anatomically specific MRI antenna.

Another aspect is the addition of antennae, otherwise referred to herein as dual tuned coils, which can operate in both transmit mode and receive mode at more than one frequency, and, in the case of the receive antennae, they are configured with multiple resonators which further improve the spatial and temporal resolution of the MRI scan for more than one nuclei. For these multi-nuclear antenna to operate in acquiring MRI data from nuclei other than the excitation and reception of hydrogen, an amplified transmit signal at a non-hydrogen frequency may be generated and applied to the second frequency transmit coil 17a. Similarly, the receiver array of resonators 10 may be switched to a non-hydrogen operating mode, and the signals from the resonators may then be transmitted to a first stage of non-hydrogen pre-amplifiers which may be configured to be connected directly to, and built into, the resonator circuitry, before being transmitted to another stage of amplification configured in the housing of the switchable receiver 15. The signal output of switchable receiver 15, which may have been converted back to the first frequency, i.e., the hydrogen frequency, may be sent back to the common MRI system receiver coil port 14 which then delivers these converted signals back to the MRI system at the hydrogen frequency for image processing and display. The MRI system may remain operating at the hydrogen frequency as if the other frequency was never present.

Similarly, during the MRI pulse sequence (chosen by the operator from the operating console as normal), a small transmit signal of hydrogen frequency may be delivered to the local antenna transmit port 9 where it is connected to frequency converter 16 containing frequency conversion logic 16a and second frequency power amplifier 16b, which amplifies the converted signal at the non-hydrogen frequency. This power is then applied to the second frequency transmit coil, or antenna, 17a that is operable at the non-hydrogen frequency. As MRI relies on timing synchronization of the transmit pulses and receiver signals, both of the switchable receiver 15 and frequency converter 16 may be maintained in frequency and phase synchronization via a direct connection to each other of a common local oscillator signal used in both units, which is also synchronized with the excitation signals delivered by the local transmit coil port 9 and commonly used receiver array control signals provided at the receiver coil port 14. Another aspect is the use of completely non-magnetic components (magnetic or ferrous materials cannot be placed in the MRI bore as they substantially distort the desired homogeneity of the static magnetic field of the MRI as well as present safety hazards from becoming projectiles in the changing fields) in the switchable receiver 15 and frequency converter 16, so that placement in or proximate to the MRI bore does not interfere with MRI processes. Another aspect is that the MRI system may simply use the described local coil configuration file to provide the control logic signals, via common ports 9 and 14, necessary to activate either the hydrogen mode or the non-hydrogen mode of the units 10, 17a, 15 and 16 so that they may operate in either nuclei or frequency mode. In short, the receiver antenna array of multiple resonators may be switched between hydrogen frequency or non-hydrogen frequencies using these control signals, and the MRI signal outputs of 10 are either switched directly through unit 15 to port 14 for processing if operating in hydrogen mode, or if operating in non-hydrogen frequency, they are further amplified and converted from non-hydrogen frequency to hydrogen frequency and then routed to port 14.

Similarly, the transmit signal at switch 8 can be routed to the system body coil for transmitting power at the hydrogen frequency through body coil transmit antenna 17b, or routed through switch 8 and port 9 to unit 16 for frequency conversion and power amplification of non-hydrogen excitation signal before being sent to the local transmit antenna 17a operating at the non-hydrogen frequency. In some implementations, it may be beneficial to employ a post-processing algorithm to re-encode raw data sets obtained from non-hydrogen frequencies before presenting in true two or three-dimensional images. As implementation of the dual tuned coil package may result in MRI scanning without any changes regarding spatial localization accomplished with the gradient coils 5b, some distortion to an image reconstructed from the non-hydrogen frequency system may be encountered due to the gradients being "calibrated" for hydrogen frequency spatial encoding. The post-processing algorithm may be implemented via post-processing software which communicates with the computer via a common ethernet port available on all MRI systems. In various examples, the image set may be sent out for the post-processing and then returned to the computer for display on the console in the traditional manner. Thus, with various examples, one can simply utilize the resonators, second frequency transmit coil, switchable receiver, and frequency converter in a similar fashion to that in which one might connect any transmit/receive antenna set to the common local transmit coil and receiver coil ports, and create a multiple nuclei MRI system from a single nuclei system on demand.

Figure 10:
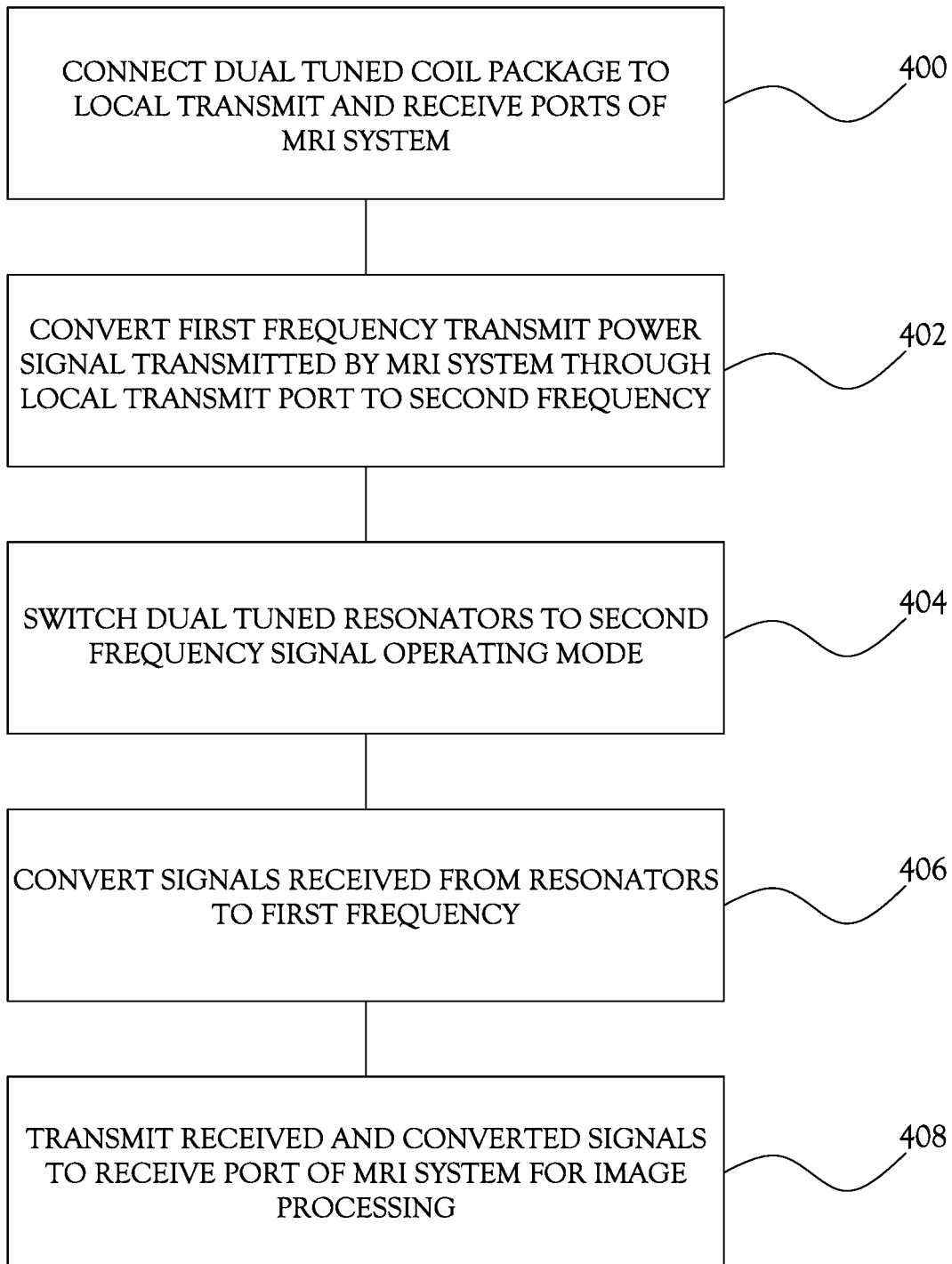
FIG. 10 illustrates a method of dual tuned MRI resonator and coil package.

FIG. 10 illustrates a method of dual tuned MRI resonator and coil package. It is understood that the operations illustrated in FIG. 10 are merely those of an example, and may include more or fewer operations, and/or in a different order, than those presented in FIG. 10. Further, for the sake of clarity, the operations illustrated in FIG. 10 simply discuss the use of the second frequency that is converted from the first frequency transmitted by the MRI system in use. However, it is noted that, as discussed in regard to FIGS. 8 and 9, an alternative parallel path is used in the switchable receiver 15 when the dual tuned MRI resonator and coil package is connected to the MRI system but operating in the hydrogen (1H) frequency, such as when the transmit power is being transmitted by the system transmit coil. The dual tuned resonator and coil package can be used in such a case merely for convenience, but may still be beneficial in obtaining improved results in the imaging by the MRI system. For example, when the dual tuned resonator and coil package of the present general inventive concept is used with the hydrogen frequency from the system transmit coil, no frequency conversion is performed, but improved reception results may occur from using the high sensitivity, multi-channel dual tuned receiver coil (antenna) 18 operating at the hydrogen frequency. This is also convenient as no changing of coils or system set-up is required to easily switch back and forth between the first and second frequencies.

In operation 400 the dual tuned coil package is connected to the local transmit and receive ports of the MRI system. For example, in examples utilizing the switchable receiver 15 and frequency converter 16, which may be in separate housings or combined into one housing, connections from the switchable receiver 15 may be plugged into the receiver coil port 14, and the frequency converter 16 may be connected to the local transmit coil port 9. In operation 402 the first frequency transmit power signal transmitted by the MRI system is received by the frequency converter 16 to be converted to a second frequency and amplified before being transmitted to the dual tuned coil package 2. In operation 404, the dual tuned resonators 10 in the dual tuned receiver coil 18 are switched to a second frequency signal operating mode. In various example embodiments, the switch to the second frequency signal operating mode may be implemented by switching logic supplied locally to the dual tuned coil package, or may be implemented through operational control from the system controller 4. In operation 406, the resonator signals of the second frequency are received by the switchable receiver 15 to be amplified and converted back to the first frequency. In operation 408, the switchable receiver 15 transmits the first frequency image signals to the receiver coil port of the MRI system for image processing. Upon receiving the first frequency image signals, the MRI system then performs image processing as if in receipt of signals that were transmitted through the coils at the same frequency at which the MRI system originally generated, such as hydrogen signals.

Various examples may provide a dual frequency coil package used in transmitting and receiving at least two frequencies in an MRI system, the dual frequency coil package including a dual tuned receiver coil configured to receive at least two frequencies, including at least a first frequency and a second frequency, in operative communication with the MRI system through a first local port of the MRI system, and a second frequency transmit coil configured to transmit the second frequency in operative communication with the MRI system through a second local port of the MRI system. The dual frequency coil package may further include one or more amplifiers included in the dual tuned receiver coil to amplify a signal transmitted by the dual tuned receiver coil. The dual frequency coil package may further include one or more resonators that are switchable so as to receive the first frequency in a first frequency mode, and to receive the second frequency in a second frequency mode. Each of the one or more resonators may include one or more fixed capacitors to generate resonance of the respective one or more resonators at the first frequency, and one or more variable frequency capacitors to shift the generated resonance of the respective one or more resonators to the second frequency in response to being activated. The one or more variable frequency capacitors may be in a variable frequency circuit including a switch to activate the one or more variable frequency capacitors. The one or more fixed capacitors may be in operative communication with the variable frequency circuit. Each of the one or more resonators may include a preamplifier circuit to respectively amplify the first and second frequencies and match an output impedance of the respective one or more resonators to a receiver of the MRI system. The preamplifier circuit may amplify a signal output by the respective one or more resonators from 20 to 30 decibels. Each of the one or more resonators may include a first frequency decoupler to passively decouple the respective one or more resonators at the first frequency, and a second frequency decoupler to decouple the respective one or more resonators at the second frequency. The second frequency decoupler may include a passive decoupler and an active decoupler. The dual tuned receiver coil may be switchable between a first frequency mode to receive the first frequency, and a second frequency mode to receive the second frequency. The dual frequency coil package may further include one or more dual frequency resonators each including switchable logic to switch a resonant frequency of the respective dual frequency resonators between the first and second frequency modes.

Various examples may provide a frequency converter and receiver system for use with a dual frequency coil package used in an MRI system, the frequency converter and receiver system including, a switchable receiver including one or more channels each channel receiving at least two frequencies, including at least a first frequency and a second frequency, each of the one or more channels including, an input configured to receive the at least two frequencies, an output configured to output the second frequency, a first frequency path configured to pass the first frequency between the input and the output, a second frequency path configured to convert the second frequency to the first frequency between the input and the output, a first switch to switch electrical communication from the input between the first and second frequency paths, and a second switch to switch electrical communication to the output between the first and second frequency paths, and a frequency converter to receive the first frequency, convert the first frequency to the second frequency, and output the second frequency, wherein the switchable receiver and the frequency converter are in electrical communication such that the first and second frequencies are in phase after frequency conversions. The first and second switches may be controlled by a logic signal from the MRI system. The frequency converter may include a first phase lock loop including a local oscillator, where the first phase lock loop receives the first frequency input to the frequency converter, locks the first frequency in phase with a first reference frequency from the local oscillator, and outputs the reference frequency, a first frequency mixer that receives the first frequency input to the frequency converter and the reference frequency and outputs the second frequency, and a first amplifier to amplify the second frequency. The second frequency path may include a second amplifier to receive the second frequency from the first switch and amplify the second frequency, a second phase lock loop configured to be in electrical communication with the first phase lock loop so as to lock the first reference frequency in phase with the first frequency, a second frequency mixer configured to receive the second frequency from the second amplifier and the first reference frequency from the second phase lock loop and output the first frequency to the second switch. The frequency converter may include a first phase lock loop including a first local oscillator, the first phase lock loop configured to receive the first frequency, lock the a first reference frequency from the first local oscillator in phase with the first frequency, and output the first reference frequency, a first frequency mixer that receives the first frequency input to the frequency converter and the first reference frequency and outputs a third frequency, a second phase lock loop including a second local oscillator, the second phase lock loop in electrical communication with the first phase lock loop, locks a second reference frequency from the second local oscillator with the first frequency, and outputs the second reference frequency, a second frequency mixer to receive the third frequency and the second reference frequency and output the second frequency, and a first amplifier to amplify the second frequency. The second frequency path may include a second amplifier to receive the second frequency from the first switch and amplify the second frequency, a third phase lock loop in electrical communication with the second phase lock loop so as to lock the second reference frequency in phase with the first frequency, a third frequency mixer to receive the second frequency from the second amplifier and the second reference frequency from the third phase lock loop and output the third frequency, a fourth phase lock loop in electrical communication with the first phase lock loop so as to lock the first reference frequency in phase with the first frequency, and a fourth frequency mixer configured to receive the third frequency from the third frequency mixer and the first reference frequency from the fourth phase lock loop and output the first frequency to the second switch. The outputs of the switchable receiver may be connected to a local receiver coil port of the MRI system. An input of the frequency converter may be connected to a local transmit coil port of the MRI system.

Various examples may provide a dual frequency coil package system for use in transmitting and receiving at least two frequencies in an MRI system, the dual frequency coil package system including a frequency converter to be selectively coupled to a local transmit coil port of the MRI system, to receive a first frequency through the local transmit coil port, to convert the first frequency to the second frequency, and to output the second frequency, a second frequency transmit coil configured be in electrical communication with the frequency converter so as to receive the second frequency from the frequency converter and to transmit the second frequency in operative communication with the MRI system, a dual tuned receiver coil to receive at least two frequencies, including at least the first frequency and the second frequency, and to output the at least two frequencies, and a switchable receiver to receive the at least two frequencies output from the dual tuned receiver coil, including at least the first frequency and the second frequency, and in electrical communication with the dual tuned receiver coil and selectively coupled to a local receiver coil port of the MRI system such that the switchable receiver and dual tuned receiver coil are in operative communication with the MRI system, wherein the switchable receiver transmits the first frequency received from the dual tuned receiver coil directly to the MRI system and converts the second frequency received from the dual tuned receiver coil to the first frequency before transmission to the MRI system. The dual tuned receiver coil may include one or more resonators that are switchable so as to receive the first frequency in a first frequency mode, and to receive the second frequency in a second frequency mode, the switchable receiver may include one or more channels each configured to receive at least the first and second frequencies, and each of the one or more resonators of the dual tuned receiver coil in respective communication with one of the one or more channels of the switchable receiver.

Various examples may provide a method of using a dual frequency coil package in an MRI system, the method including connecting a dual tuned coil package to local transmit and receive ports of the MRI system, converting a first frequency transmit power signal transmitted from the MRI system through the local transmit port to a second frequency transmit power signal, switching dual tuned resonators to a second frequency signal operating mode, converting second frequency signals received from resonators during a transmit pulse to the first frequency, and transmitting received first and converted first frequency signals to the local receive port of the MRI system for image processing. The method may further include controlling the switching of the dual tuned resonators and the converting of the signals received from the resonators through control logic connections of the local receive port. The method may further include locking the frequencies in phase during frequency conversions.

Various examples may include a dual frequency resonator that receives at least two frequencies, the dual frequency resonator including one or more fixed capacitors to generate resonance of the dual frequency resonator at a first frequency, a variable frequency circuit to generate resonance of the dual frequency resonator at a second frequency, wherein the one or more fixed capacitor are in operative communication with the variable frequency circuit, a preamplifier input circuit to amplify the first frequency and the second frequency received by the dual frequency resonator to match frequency and impedance of a magnetic resonance imaging system receiver, wherein the preamplifier input circuit is in operative communication with the one or more fixed capacitors and the variable frequency circuit, a first frequency decoupler circuit configured to passively decouple the dual tuned resonator at the first frequency, wherein the first frequency decoupler is in operative communication with the one or more fixed capacitors, the variable frequency circuit, and the preamplifier input circuit, a second frequency decoupler circuit to decouple the dual tuned resonator at the second frequency, the second frequency decoupler including a passive decoupler and an active decoupler, wherein the second frequency decoupler is in operative communication with the one or more fixed capacitors, the variable frequency circuit, and the preamplifier input circuit.

Various examples of the present general inventive concept may provide a dual frequency coil package for transmitting and receiving at least two frequencies to an MRI system, the dual frequency coil package including a dual tuned receiver coil configured to receive at least two frequencies, the dual tuned receiver including one or more dual tuned resonators, the one or more dual tuned resonators including one or more fixed capacitors to generate resonance of the dual frequency resonator at a first frequency, a variable frequency circuit to generate resonance of the dual frequency resonator at a second frequency, wherein the one or more fixed capacitor are in operative communication with the variable frequency circuit, a preamplifier input circuit to amplify the first frequency and the second frequency received by the dual frequency resonator to match frequency and impedance of a magnetic resonance imaging system receiver, wherein the preamplifier input circuit is in operative communication with the one or more fixed capacitors and the variable frequency circuit, a first frequency decoupler circuit to passively decouple the dual tuned resonator at the first frequency, wherein the first frequency decoupler is in operative communication with the one or more fixed capacitors, the variable frequency circuit, and the preamplifier input circuit, a second frequency decoupler circuit to decouple the dual tuned resonator at the second frequency, the second frequency decoupler comprising, a passive decoupler and an active decoupler, wherein the second frequency decoupler is in operative communication with the one or more fixed capacitors, the variable frequency circuit, and the preamplifier input circuit, and wherein the dual tuned receiver coil is in operative communication with the MRI system, a second frequency transmit coil configured to transmit the second frequency, wherein the second frequency transmit coil is in operative communication with the MRI system.

Various examples may provide a dual frequency coil package for transmitting and receiving at least two frequencies to an MRI system, the dual frequency coil package including a dual tuned receiver coil configured to receive at least two frequencies, the dual tuned receiver coil including one or more dual tuned resonators, the one or more dual tuned resonators including one or more fixed capacitors configured to generate resonance of the dual frequency resonator at a first frequency, a variable frequency circuit configured to generate resonance of the dual frequency resonator at a second frequency, wherein the one or more fixed capacitors are in operative communication with the variable frequency circuit, a preamplifier circuit configured to the first frequency and the second frequency received by the dual frequency resonator to match frequency and impedance of a magnetic resonance imaging system receiver, wherein the preamplifier input circuit is in operative communication with the one or more fixed capacitors and the variable frequency circuit, a first frequency decoupler circuit configured to passively decouple the dual tuned resonator at the first frequency, wherein the first frequency decoupler in operative communication with the one or more fixed capacitors, the variable frequency circuit, and the preamplifier input circuit, a second frequency decoupler circuit configured to decouple the dual tuned resonator at the second frequency, the second frequency decoupler including a passive decoupler and an active decoupler, wherein the second frequency decoupler is in operative communication with the one or more fixed capacitors, the variable frequency circuit, and the preamplifier input circuit, and wherein the dual tuned receiver coil is in operative communication with the MRI system, a second frequency transmit coil configured to transmit the second frequency, wherein the second frequency transmit coil is in operative communication with the MRI system, a switchable receiver configured to transmit the first frequency to an analog converter of the MRI system, the switchable receiver including a switchable receiver switch configured to engage a second frequency converter and amplifier when the dual tuned receiver coil receives at the second frequency, wherein the switchable receiver switch is in operative communication with the second frequency converter and amplifier and the dual tuned receiver coil, a second frequency converter and amplifier configured to convert the second frequency to the first frequency and amplify the converted second frequency, wherein the switchable receiver is in operative communication with the analog converter of the MRI system, a frequency converter configured to convert a first frequency of the MRI system to a second frequency when the dual tuned receiver receives at the second frequency, wherein the frequency converter is in operative communication with the MRI system, a second frequency power amplifier configured to amplify the second frequency of the MRI system when the frequency converter converts the first frequency to the second frequency, wherein the second frequency power amplifier is in operative communication with the frequency converter and the second frequency transmit coil.

Note that spatially relative terms, such as "up," "down," "right," "left," "beneath," "below," "lower," "above," "upper," and the like may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The invention claimed is:

1. A mononuclear Magnetic Resonance Imaging upgrade system for use in transmitting and receiving at least two frequencies with the mononuclear Magnetic Resonance Imaging system, the upgrade system comprising:
 a frequency converter configured to be selectively coupled to a local transmit coil port of the mononuclear Magnetic Resonance Imaging system, to receive a first frequency through the local transmit coil port, to convert the first frequency to a second frequency by translating the first frequency, and to output the second frequency;
 a second frequency power amplifier configured to be in electrical communication with the frequency converter, and configured to receive the second frequency from the frequency converter and to transmit the second frequency to a second frequency transmit coil;
 the second frequency transmit coil configured to be in electrical communication with the second frequency power amplifier to receive the second frequency from the frequency converter and to transmit the second frequency;
 a dual tuned receiver coil configured to receive at least two frequencies, including at least the first frequency and the second frequency, and to output the at least two frequencies; and
 a switchable receiver configured to receive the at least two frequencies output from the dual tuned receiver coil, and configured to be in electrical communication with the dual tuned receiver coil and selectively coupled to a local receiver coil port of the mononuclear Magnetic Resonance Imaging system;

wherein the switchable receiver is configured to transmit the first frequency received from the dual tuned receiver coil directly to the mononuclear Magnetic Resonance Imaging system and to convert the second frequency received from the dual tuned receiver coil to the first frequency before transmission to the mononuclear Magnetic Resonance Imaging system.

2. The upgrade system of claim 1, wherein the dual tuned receiver coil is configured with one or more resonators that are tunable to receive the at least two frequencies, including at least the first frequency and the second frequency, and one preamplifier for each of the one or more resonators to amplify a signal transmitted by the dual tuned receiver coil at the first frequency and the second frequency.

3. The upgrade system of claim 2, wherein the preamplifier is configured to shift a center frequency to match center frequencies of the first frequency and the second frequency.

4. The upgrade system of claim 1, wherein the second frequency corresponds to a precessional frequency of fluorine.

5. The upgrade system of claim 2, wherein each of the one or more resonators comprises:
one or more fixed capacitors configured to generate resonance of the respective one or more resonators at the first frequency; and
one or more variable frequency capacitors configured to shift the generated resonance of the respective one or more resonators to the second frequency in response to being activated.

6. The upgrade system of claim 5, wherein the one or more variable frequency capacitors are configured in a variable frequency circuit using varactors and fixed capacitors.

7. The upgrade system of claim 6, wherein the one or more fixed capacitors are in operative communication with the variable frequency circuit.

8. The upgrade system of claim 5, wherein each of the one or more resonators comprises:
a preamplifier circuit configured to respectively amplify the first and second frequencies and match an output impedance of the respective one or more resonators to a receiver of the mononuclear Magnetic Resonance Imaging system;
wherein an active bandwidth or center frequency of the preamplifier circuit is shifted by changing an input impedance of the preamplifier circuit.

9. The upgrade system of claim 8, wherein the preamplifier circuit is configured to amplify a signal output by the respective one or more resonators from 20 to 30 decibels.

10. The upgrade system of claim 5, wherein each of the one or more resonators comprises:
a first frequency decoupler configured to passively decouple the respective one or more resonators at the first frequency; and
a second frequency decoupler configured to decouple the respective one or more resonators at the second frequency.

11. The upgrade system of claim 10, wherein the second frequency decoupler comprises a passive decoupler and an active decoupler.

12. The upgrade system of claim 1, wherein the dual tuned receiver coil is configured to be tunable between a first frequency mode to receive the first frequency, and a second frequency mode to receive the second frequency.

13. The upgrade system of claim 12, further comprising one or more dual frequency resonators each configured with tunable logic to tune a resonant frequency of the respective dual frequency resonators between the first and second frequency modes.

* * * * *